United States Patent
Moul et al.

(10) Patent No.: US 8,766,104 B2
(45) Date of Patent: Jul. 1, 2014

(54) PRINTED CIRCUIT BOARDS INCLUDING STRIP-LINE CIRCUITRY AND METHODS OF MANUFACTURING SAME

(75) Inventors: Wayne L. Moul, Loveland, CO (US); Robert J. Behnke, II, Erie, CO (US); Scott E. M. Frushour, Boulder, CO (US); Jeffrey L. Jensen, Boulder, CO (US)

(73) Assignee: Covidien LP, Mansfield, MA (US)

( * ) Notice: Subject to any disclaimer, the term of this patent is extended or adjusted under 35 U.S.C. 154(b) by 86 days.

(21) Appl. No.: 13/352,909

(22) Filed: Jan. 18, 2012

(65) Prior Publication Data

US 2013/0180762 A1 Jul. 18, 2013

(51) Int. Cl.
*H05K 1/16* (2006.01)
*H05K 1/18* (2006.01)
*H05K 3/46* (2006.01)

(52) U.S. Cl.
CPC .............. *H05K 1/183* (2013.01); *H05K 3/4694* (2013.01)
USPC .......................................... 174/260; 361/761

(58) Field of Classification Search
CPC ........................... H05K 1/183; H05K 1/46943
USPC .............. 361/761–764; 174/260; 29/846–854
See application file for complete search history.

(56) References Cited

U.S. PATENT DOCUMENTS

| | | |
|---|---|---|
| 4,898,540 A | 2/1990 | Saito |
| 4,901,039 A | 2/1990 | Corzine et al. |
| 5,028,896 A | 7/1991 | Kuokkanen |
| 6,066,386 A | 5/2000 | Boyko et al. |
| 6,137,237 A | 10/2000 | MacLennan et al. |
| 6,225,756 B1 | 5/2001 | Gitsevich |
| 6,313,587 B1 | 11/2001 | MacLennan et al. |
| 6,329,603 B1 | 12/2001 | Japp et al. |
| 6,535,085 B2 | 3/2003 | Song et al. |
| 6,900,986 B2* | 5/2005 | Kimoto et al. ................ 361/704 |
| 6,949,887 B2 | 9/2005 | Kirkpatrick et al. |
| 7,400,214 B2 | 7/2008 | Storniolo et al. |
| 7,561,006 B2 | 7/2009 | Dutta |
| 7,982,560 B2 | 7/2011 | Hesselbarth |
| 8,218,337 B2* | 7/2012 | Choudhury et al. .......... 361/818 |
| 8,400,776 B2* | 3/2013 | Sahara et al. ................. 361/765 |
| 2009/0009261 A1 | 1/2009 | Song |
| 2009/0112200 A1 | 4/2009 | Eggers |
| 2010/0052993 A1 | 3/2010 | Kim |
| 2010/0171574 A1 | 7/2010 | Sakiyama et al. |

FOREIGN PATENT DOCUMENTS

KR 10-2005-0027461 A 3/2005

OTHER PUBLICATIONS

PCT International Search Report dated Apr. 29, 2013 for PCT/US2013/021706.

* cited by examiner

*Primary Examiner* — Jeremy C Norris

(57) ABSTRACT

A multi-layer printed circuit board includes a first layer stack and a second layer stack coupled to the first layer stack. The first layer stack includes a first electrically-insulating layer, a second electrically-insulating layer, and a first electrically-conductive layer disposed between the first and second electrically-insulating layers. The second layer includes a third electrically-insulating layer and a second electrically-conductive layer. The first layer stack and/or the second layer stack include a cut-out area defining a void that extends therethrough. The multi-layer printed circuit board further includes a first signal layer disposed in association with the first electrically-insulating layer of the first layer stack or the third electrically-insulating layer of the second layer stack, a second signal layer disposed in association with the second electrically-insulating layer of the first layer stack, and a device at least partially disposed within the cut-out area and electrically-coupled to the first and second signal layers.

13 Claims, 21 Drawing Sheets

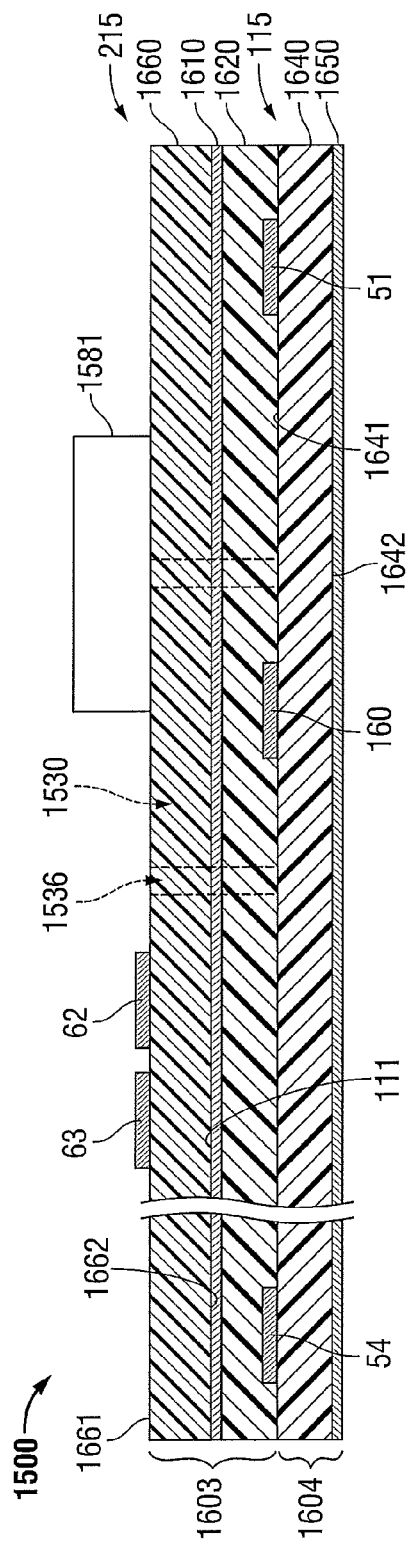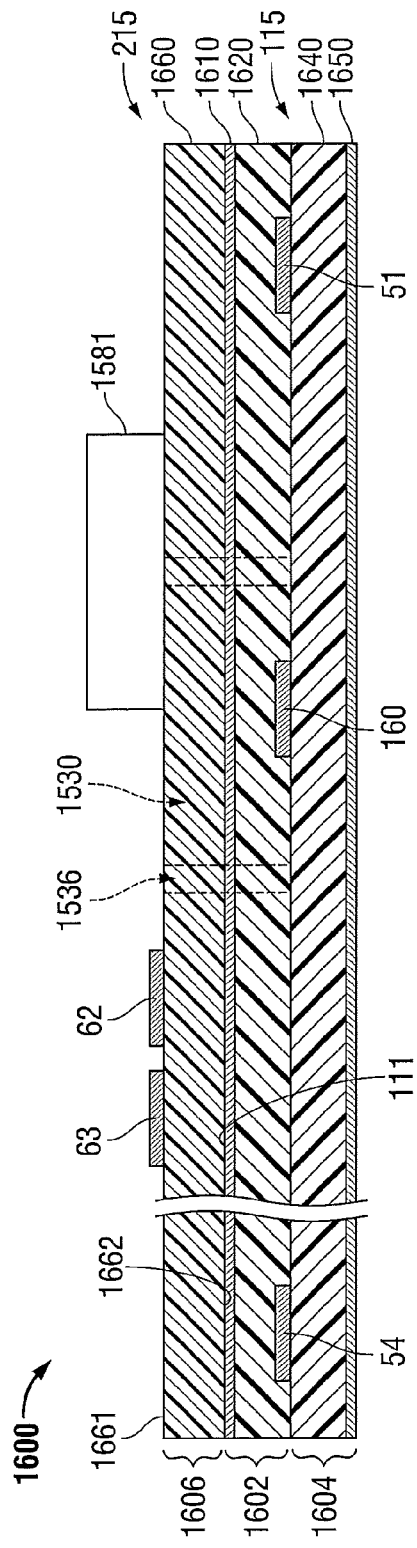

PRINTED CIRCUIT BOARDS INCLUDING STRIP-LINE CIRCUITRY AND METHODS OF MANUFACTURING SAME

BACKGROUND

1. Technical Field

The present disclosure relates to strip-line circuitry. More particularly, the present disclosure relates to printed circuit boards including strip-line circuitry and methods of manufacturing the same.

2. Discussion of Related Art

Commonly used techniques for circuit and/or system interconnect include microstrip and strip-line transmission lines. In a simple representation, as shown in FIG. 1, a microstrip transmission line consists of a conductive trace 13 of controlled width $W_C$ disposed on a low-loss dielectric 11 which is, in turn, disposed on a ground-plane layer 12. In microstrip there is one ground plane, while in strip-line, there are two.

Microstrip and strip-line transmission lines can be fabricated using printed circuit board technology. Printed circuit boards (PCBs), sometimes referred to as printed wiring boards (PWBs) or etched wiring boards, are widely used in the assembly of discrete electrical components into operating circuits. PCBs generally provide a reliable and economical means of interconnecting electrical signals between system components. PCBs are available in a variety of different types and may be classified in a variety of ways.

PCBs are generally used to mechanically support and electrically connect electronic components using electrically-conductive pathways or signal traces that conduct signals on the PCB. A typical PCB includes one or more layers of insulating material upon which patterns of electrical conductors are formed. In addition to a pattern of conductive traces on the PCB, a patterned array of metal-filled through-holes, or vias, may be formed to allow for layer-to-layer interconnections between various conductive features.

PCBs may be classified as single-sided PCBs, double-sided PCBs, and multi-layer PCBs, according to the number of circuit pattern surfaces. Microstrip transmission lines, for example, are commonly fabricated on double-sided PCBs. PCBs may include circuits that perform a single function or multiple functions.

A typical PCB may include a variety of electronic components. Electronic components form parts of electronic circuitry and may be classified in a variety of ways. An electronic component may be classified as active or passive. In general, an active component is any type of circuit component with the ability to electrically control the flow of electrons or other electrically-charged particles. Some examples of active components are transistors, integrated circuits (ICs), silicon-controlled rectifiers (SCRs), and triodes for alternating current (TRIACs). Components incapable of controlling current by means of another electrical signal are generally classified as passive components. Examples of passive components include capacitors, resistors, inductors, transformers, and diodes. A PCB on which electronic components are mounted is sometimes referred to as a printed circuit assembly (PCA) or a printed circuit board assembly (PCBA).

In some circuits, such as high-frequency circuits, e.g., microwave circuits, maintaining controlled impedance across the PCB may be required in order to achieve consistent electrical performance, e.g., in terms of amplitude and phase response. A variety of PCB trace geometries are possible with controlled impedance designs. A two-sided PCB design wherein a planar conductor line is spaced above a ground plane, as shown in the cross-sectional view of FIG. 1, can be designed for controlled characteristic impedance. This geometry is known as a surface microstrip, or simply microstrip. In microstrip the planar conductor lines are usually formed by chemically etching away unwanted areas of material, e.g., metal, from a conductor layer, such as copper.

The impedance of a planar conductor in a microstrip transmission line format is determined by factors such as the dielectric characteristics of the surrounding materials, the width of the conductor line and its spacing from the ground-plane layer, among other things. In the surface microstrip configuration the signal conductor is exposed to air, so the effective dielectric constant impacting the impedance of the conductor is a combination of the relative dielectric constant, $\in_r$, of the PCB dielectric substrate as well as that of the air above the circuit. Typically, the effective dielectric constant will be somewhere between 1 ($\in_r$ of air) and about 4 ($\in_r$ of FR-4 substrate).

An approximate expression of the characteristic impedance $Z_0$ of a microstrip transmission line, as shown in FIG. 1, is given by Equation 1 (below) and is expressed in Ohms (Ω). In Equation 1, the measurement unit is mils, i.e., 1 mil=0.001 inches.

FIG. 1 shows a microstrip transmission line 10 that includes a signal trace 13 on the top side of a PCB dielectric substrate 11 and a ground (or power) plane 12 on the bottom side of the substrate 11. Using Equation 1, for the signal trace 13 of width $W_C$ and thickness $T_C$, separated by distance $T_D$ from the ground plane 12 by the PCB dielectric substrate 11, the characteristic impedance $Z_0$ of the microstrip line 10 may be expressed as $$Z_0(\Omega) \approx \frac{87}{\sqrt{\varepsilon_r + 1.41}} \ln\left[\frac{5.98 T_D}{(0.8 W_C + T_C)}\right], \quad \text{(Equation 1)}$$

where $\in_r$ is the dielectric constant of the PCB substrate 11. Equation 1 is generally valid when $0.1 < W_C/T_D < 2.0$ and $1 < \in_r < 15$.

Microstrip transmission line operation may be impaired by stray electromagnetic coupling between the line conductor and nearby objects. In microstrip, the line conductor is coupled to the ground plane below, which reduces EMI (electromagnetic interference) by absorbing some of the electromagnetic field lines. Fringing of the electromagnetic fields that extend above the line conductor to foreign objects may introduce irregularities into the impedance and velocity factor of the line, with a resultant negative effect on circuit performance. To mitigate the effects of electrical field fringing, additional constraints may be imposed, e.g., requiring the width of the ground plane be such that it extends past each edge of the signal trace by at least the width of the signal trace.

Strip-line transmission line construction, as shown in the cross-sectional view of FIG. 2, is generally characterized by a planar conductive trace 23 sandwiched by dielectric material 21 and disposed between two ground or power planes (commonly referred to as reference planes). An electric field 46 is generated between the conductor line 23 and the upper and lower ground layers 24 and 22, and a magnetic field 58 is generated around the conductor line 23. In strip-line routing, the second ground (or power) plane, which is omitted in microstrip construction, shields the conductor from the effects of nearby objects and serves to confine the electromagnetic fields to the region between the two reference planes.

In strip-line routing, all of the electromagnetic field lines are coupled to the upper and lower reference planes, and the chance of stray coupling between the line conductor and nearby objects is avoided. In addition to minimal radiation losses, a strip-line circuit's upper and lower ground planes may form a more efficient ground return path with less surface resistance than in the microstrip configuration.

An expression of the characteristic impedance, $Z_{0sym}$, of a symmetric (balanced) strip-line, as shown in FIG. 1, is given by Equation 2. Using Equation 2, for the signal trace 23 of width $W_C$ and thickness $T_C$, sandwiched by the PCB dielectric 21 of thickness $T_D$ disposed between the reference planes 22 and 24, the characteristic impedance $Z_{0sym}$ of the symmetric strip-line 20 can be expressed as $$Z_{0sym}(\Omega) \approx \frac{60}{\sqrt{\varepsilon_r}} \ln\left[\frac{4T_D}{0.67\pi(0.8W_C + T_C)}\right], \quad \text{(Equation 2)}$$

where $\varepsilon_r$ is the dielectric constant of the PCB dielectric 21. Equation 2 is generally valid for the following dimension ratios: $W_C/(T_D-T_C)<0.35$ and $T_C/B<0.25$.

Microstrip and strip-line technologies are most commonly used routing configurations in circuits and can be used to provide well-characterized transmission line conductors that can be used to interconnect discrete circuit elements and to perform various impedance transformation functions. Strip-line transmission lines offer some electrical performance advantages compared to microstrip, but strip-line is more complex to fabricate than microstrip. In high-frequency circuits, e.g., microwave circuits, cost and/or space savings may be attained by using strip-line technology.

SUMMARY

A continuing need exists for methods of manufacturing strip-line circuits with improved fabrication and assembly techniques. A continuing need exists for strip-line configurations on printed circuit boards at lower costs. There is a need for methods of reducing the time, complexity and/or cost of strip-line fabrication operations and/or printed circuit board inspection, test, and/or rework. There is a need for methods of manufacturing printed circuit boards that allow access to components assembled into strip-line configurations.

According to one aspect, a printed circuit board is provided. The printed circuit board includes a first layer stack and a second layer stack coupled to the first layer stack. The first layer stack includes a first electrically-insulating layer, a first electrically-conductive layer, and a cut-out area defining a void that extends therethrough. The first electrically-insulating layer includes a first surface and an opposite second surface. The first electrically-conductive layer is disposed on the first surface of the first electrically-insulating layer. The second layer stack includes a second electrically-insulating layer. The second electrically-insulating layer includes a first surface and an opposite second surface. The second layer stack may further include a second electrically-conductive layer disposed on the second surface of the second electrically-insulating layer. One or more electrically-conductive traces are disposed on the first surface of the second electrically-insulating layer. The printed circuit board further includes a device at least partially disposed within the cut-out area. The device is electrically-coupled to at least one of the one or more electrically-conductive traces disposed on the first surface of the second electrically-insulating layer. The second layer stack may further include a second electrically-conductive layer disposed on the second surface of the second electrically-insulating layer.

According to one aspect, a multi-layer printed circuit board is provided. The multi-layer printed circuit board includes a first layer stack and a second layer stack coupled to the first layer stack. The first layer stack includes a first electrically-insulating layer, a second electrically-insulating layer, and a first electrically-conductive layer disposed between the first and second electrically-insulating layers. The second layer includes a third electrically-insulating layer and a second electrically-conductive layer. The first layer stack and/or the second layer stack include a cut-out area defining a void that extends therethrough. The multi-layer printed circuit board further includes a first signal layer and a second signal layer. The first signal layer is disposed in association with the first electrically-insulating layer of the first layer stack or the third electrically-insulating layer of the second layer stack. The second signal layer is disposed in association with the second electrically-insulating layer of the first layer stack. The multi-layer printed circuit board further includes a device at least partially disposed within the cut-out area. The device is electrically-coupled to the first signal layer and/or the second signal layer.

In any one of the above aspects, the cut-out area may be configured to receive therein at least a portion of the device. In any one of the above aspects, the device includes a top surface of the device is disposed below the second surface of the first electrically-conductive layer. In any one of the above aspects, the printed circuit board or multi-layer printed circuit board may further include a sheet of electrically-conductive material including a first portion configured to cover the cut-out area. The sheet of electrically-conductive material may further include a second portion disposed on at least a portion of the first surface of the first electrically-conductive layer.

In any one of the above aspects, an area of the first surface of the first electrically-insulating layer disposed adjacent to the cut-out area is an exposed area. The printed circuit board or multi-layer printed circuit board may further include a sheet of electrically-conductive material including a first portion and a second portion, wherein the first portion is configured to cover the cut-out area and the second portion is disposed on the exposed area of first surface of the first electrically-insulating layer.

According to a further aspect, a method of manufacturing a printed circuit board is provided. The method includes the initial steps of providing a first layer stack and providing a second layer stack. The first layer stack includes a first electrically-insulating layer. The first electrically-insulating layer includes a first surface and one or more electrically-conductive traces disposed on the first surface. The second layer stack includes a second electrically-insulating layer and a first electrically-conductive layer. The second electrically-insulating layer includes a first surface and an opposite second surface. The first electrically-conductive layer is disposed on the first surface of the second electrically-insulating layer. The second layer stack further includes a cut-out area defining a void that extends therethrough. The cut-out area is configured to receive therein at least a portion of a device to be coupled to the first surface of the first electrically-insulating layer and/or electrically-coupled to one or more of the one or more electrically-conductive traces. The first layer stack may further include a second electrically-conductive layer disposed on the second surface of the first electrically-insulating layer. The method may further include the step of coupling the first surface of the first electrically-insulating layer to the second surface of the second electrically-insulating layer. The coupling step may include the step of orienting the first layer stack and the second layer stack in relation to one another such that the first surface of the first electrically-insulating layer opposes the second surface of the second electrically-insulating layer. The coupling step may further include the step of positioning the first layer stack and the second layer stack in relation to one another such that the cut-out area is positioned to receive the at least a portion of the device therein when the first surface of the first electrically-insulating layer is placed in contact with the second surface of the second electrically-insulating layer. The coupling step may further include the step of bonding the second electrically-conductive layer of the third layer stack to the first electrically-insulating layer of the first layer stack.

The method may further include the step of mounting the device on the first layer stack. The mounting step may include the step of placing at least a portion of the device within the cut-out area. The mounting step may further include the step of electrically-coupling the device to one or more of the one or more electrically-conductive traces. The method may further include the step of coupling a third layer stack to the first layer stack. The third layer stack may include a signal layer and a third electrically-insulating layer including a first surface and an opposite second surface. The signal layer may be disposed in association with the first surface of the third electrically-insulating layer. The third layer stack may further include a second electrically-conductive layer including a first surface and an opposite second surface, the first surface of the second electrically-conductive layer disposed on the second surface of the third electrically-insulating layer.

According to a further aspect, a method of manufacturing a printed circuit board is provided. The method includes the initial steps of providing a first layer stack including a first electrically-conductive layer and a first electrically-insulating layer and providing a second layer stack including a second electrically-insulating layer. The first electrically-insulating layer includes a first electrically-insulating layer including a first surface and an opposite second surface. The first electrically-conductive layer is disposed on the first surface of the first electrically-insulating layer. The second electrically-insulating layer includes one or more electrically-conductive traces disposed on a first surface thereof. The method also includes the steps of mounting a device on the first surface of the second electrically-insulating layer such that the device is electrically-coupled to at least one of the one or more electrically-conductive traces, and providing the first layer stack with a cut-out area defining a void that extends from the second surface of the first electrically-insulating layer to the first surface of the first electrically-conductive layer. The cut-out area is configured to receive at least a portion of the device therein. The method also includes the step of placing the first surface of the second electrically-insulating layer in contact with the second surface of the first electrically-insulating layer such that at least a portion of the device is disposed within at least a portion of the cut-out area.

According to a further aspect, a method of manufacturing a printed circuit board is provided. The method includes the initial steps of providing a first electrically-insulating layer having a first surface and an opposite second surface, providing a first electrically-conductive layer on the first surface of the first electrically-insulating layer, and providing a cut-out area defining a void that extends from the second surface of the first electrically-insulating layer to the first surface of the first electrically-conductive layer. The step of providing a first electrically-conductive layer on the first surface of the first electrically-insulating layer may include patterning, e.g., photo-etching, the first electrically-conductive layer to provide an exposed area on the first surface of the first electrically-insulating layer disposed adjacent to the cut-out area. The method also includes the steps of providing a second electrically-insulating layer having a first surface and an opposite second surface, providing a second electrically-conductive layer on the second surface of the second electrically-insulating layer, providing one or more electrically-conductive traces on the first surface of the second electrically-insulating layer, mounting a device on the first surface of the second electrically-insulating layer such that the device is electrically-coupled to at least one of the one or more electrically-conductive traces, and placing the second surface of the first electrically-insulating layer in contact with the first surface of the second electrically-insulating layer such that at least a portion of the device is disposed within at least a portion of the cut-out area.

In any one of the above aspects, the method of manufacturing a printed circuit board may further include the steps of: determining whether there remains a volume of the void defined by the cut-out area above the device; if it is determined that there remains a volume of the void defined by the cut-out area above the device, then determining whether the volume of the void defined by the cut-out area above the device is to be at least partially filled with a dielectric material other than a vacuum or a gas (or mixture of gases, such as air); and if it is determined that the volume of the void defined by the cut-out area above the device is to be at least partially filled with a dielectric material other than a vacuum or a gas or a mixture of gases, then at least partially filling the volume of the void with the dielectric material other than a vacuum or a gas or a mixture of gases.

In any one of the above aspects, the method of manufacturing a printed circuit board may further include the steps of providing a sheet of electrically-conductive material including a first portion configured to cover the cut-out area when a second portion of the sheet of electrically-conductive material is disposed on the first surface of the first electrically-conductive layer, and coupling the second portion of the sheet of the electrically-conductive material to at least a portion of the first surface of the first electrically-conductive layer.

In any one of the above aspects, the method of manufacturing a printed circuit board may further include the steps of providing a third electrically-insulating layer having a first surface and an opposite second surface, placing the second surface of the third electrically-insulating layer in contact with one of the first surface of the first electrically-conductive layer and the first surface of the second electrically-conductive layer, and providing one or more electrically-conductive traces on the first surface of the third electrically-insulating layer.

In any one of the above aspects, the method of manufacturing a printed circuit board may further include the steps of providing a third electrically-insulating layer having a first surface and an opposite second surface, placing the second surface of the third electrically-insulating layer in contact with the first surface of the second electrically-conductive layer, and providing one or more electrically-conductive traces on the first surface of the third electrically-insulating layer.

According to a further aspect, a method of manufacturing a printed circuit board is provided. The method includes the initial step of providing first and second layer stacks. The first layer stack includes a first electrically-conductive layer. The first layer stack further includes first and third electrically-insulating layers disposed on opposite sides of the first electrically-conductive layer. The second layer stack includes a second electrically-insulating layer having a first surface and an opposite second surface. The second layer stack further includes a second electrically-conductive layer disposed on the second surface of the second electrically-insulating layer.

The method further includes the steps of providing a device on the first surface of the second electrically-insulating layer such that the device is electrically-coupled to at least one of one or more electrically-conductive traces disposed on the first surface of the second electrically-insulating layer, and providing the first layer stack with a cut-out area defining a void that extends from an outer surface of the first electrically-insulating layer to an outer surface of third electrically-insulating layer. The cut-out area is configured to receive at least a portion of the device therein. The method may further include the step of placing the first surface of the second electrically-insulating layer in contact with the outer surface of the first electrically-insulating layer such that at least a portion of the device is disposed within at least a portion of the cut-out area.

The method may further include the step of providing a pattern of one or more electrically-conductive traces on one or more areas of the outer surface of the third electrically-insulating layer. The one or more areas are spaced apart from the cut-out area. The method may further include the step of providing one or more devices on the outer surface of the third electrically-insulating layer such that at least one of the one or more devices is electrically-coupled to at least one of the one or more electrically-conductive traces disposed on the outer surface of the third electrically-insulating layer.

In any one of the above aspects, the cut-out area may be configured to receive therein at least a portion of the device. In any one of the above aspects, the height of the device may be less than the thickness of the first electrically-insulating layer. In any one of the above aspects, the device may include a top surface and a bottom surface. In any one of the above aspects, the top surface of the device may be disposed below the second surface of the first electrically-conductive layer. In any one of the above aspects, the height of the device may be greater than the height of the first layer stack.

In any one of the above aspects, the printed circuit board may further include a sheet of electrically-conductive material configured to cover the cut-out area. The sheet of electrically-conductive material may include a first portion configured to cover the cut-out area and a second portion disposed on at least a portion of the first surface of the first electrically-conductive layer.

In any one of the above aspects, an area of the first surface of the first electrically-insulating layer disposed adjacent to the cut-out area may be an exposed area. In any one of the above aspects, the sheet of electrically-conductive material includes a first portion configured to cover the cut-out area and a second portion disposed on the exposed area of first surface of the first electrically-insulating layer.

In any one of the above aspects, the printed circuit board may further include one or more gap areas disposed in adjoining relation to the cut-out area. The one or more gap areas may be configured to physically isolate the device from the first electrically-conductive layer and/or electrically isolate the device from the first electrically-conductive layer.

In any one of the above aspects, the printed circuit board may further include a heat sink disposed in association with the top surface of the device.

In any one of the above aspects, the void defined by the cut-out area may include a first volume of void space defined between the top surface of the device and a plane containing the first surface of the first electrically-conductive layer. The printed circuit board may further include dielectric material disposed in at least a portion of the first volume of void space.

In any one of the above aspects, the printed circuit board may further include a sheet of electrically-conductive material configured to cover the cut-out area.

In any one of the above aspects, the printed circuit board may further include a third layer stack coupled to the first layer stack, the third layer stack including a third electrically-insulating layer having a first surface. The printed circuit board may further include a signal layer disposed in association with the first surface of the third electrically-insulating layer. The printed circuit board may further include a cut-out area defining a void that extends from the first surface of the third electrically-insulating layer to first surface of the second electrically-insulating layer.

BRIEF DESCRIPTION OF THE DRAWINGS

Objects and features of the presently-disclosed printed circuit boards including strip-line circuitry and methods of manufacturing the same will become apparent to those of ordinary skill in the art when descriptions of various embodiments thereof are read with reference to the accompanying drawings, of which:

FIG. 16A is an enlarged, cross-sectional view taken along section lines 16A-16A of FIG. 15;

FIG. 16B is an enlarged, cross-sectional view of an alternative embodiment of the PCB shown in FIGS. 15 and 16A according to the present disclosure;

DETAILED DESCRIPTION

Figure 1:
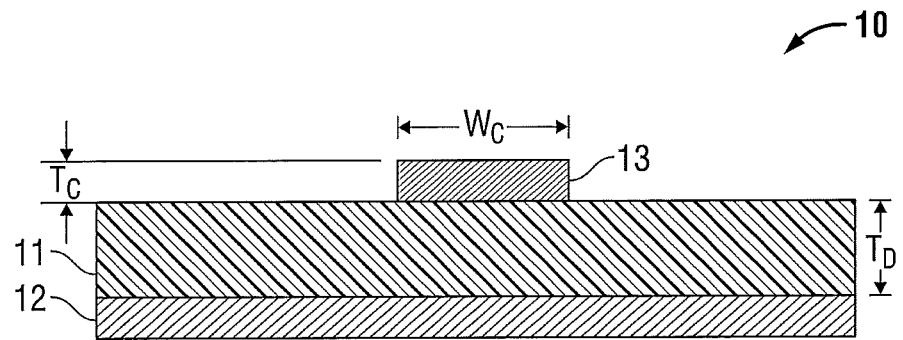
FIG. 1 is an enlarged, cross-sectional view of a printed circuit board (PCB) having a microstrip transmission line according to a conventional technology.
Figure 2:
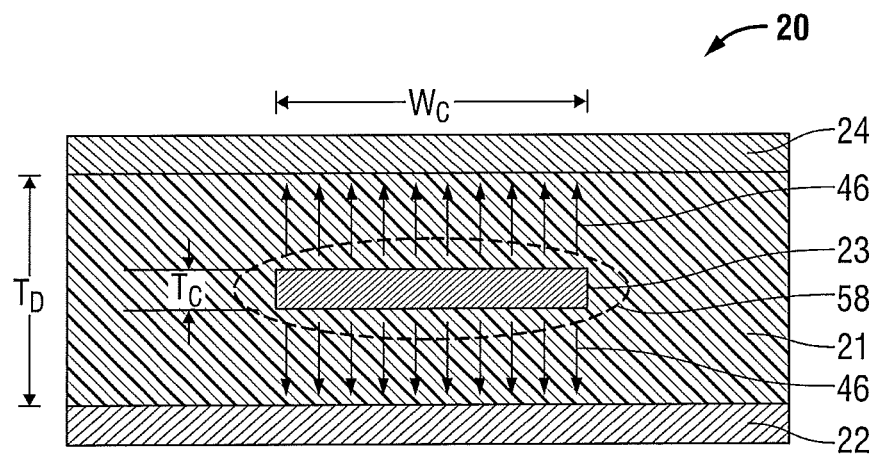
FIG. 2 is an enlarged, cross-sectional view of a PCB having a symmetric strip-line transmission line according to a conventional technology.

Hereinafter, embodiments of the presently-disclosed printed circuit boards including strip-line circuitry and methods of manufacturing the same are described with reference to the accompanying drawings. Like reference numerals may refer to similar or identical elements throughout the description of the figures. As shown in the drawings and as used in this description, and as is traditional when referring to relative positioning on an object, the term "proximal" refers to that portion of the device, or component thereof, closer to the user and the term "distal" refers to that portion of the device, or component thereof, farther from the user.

This description may use the phrases "in an embodiment," "in embodiments," "in some embodiments," or "in other embodiments," which may each refer to one or more of the same or different embodiments in accordance with the present disclosure. For the purposes of this description, a phrase in the form "A/B" means A or B. For the purposes of the description, a phrase in the form "A and/or B" means "(A), (B), or (A and B)".

As it is used in this description, "printed circuit board" (or "PCB") or "circuit boards" generally refers to systems that provide, among other things, mechanical support to electrical devices and/or components, electrical connection to and between these electrical devices and/or components, combinations thereof, and the like. For the purposes herein, the term "printed circuit board" is interchangeable with the term "printed wiring board" and either is represented herein by the acronym PCB. The PCBs described herein may include electrical components. In general, the term "printed circuit board" is interchangeable, in this disclosure, with the terms "printed circuit assembly" and "printed circuit board assembly". The PCBs and circuit boards described herein are not limited to electrical component-populated boards, but also include non-populated circuit-traced substrates of all types.

PCB embodiments described herein include one or more layer stacks formed of a plurality of layers of suitable electrically-conductive and/or non-conductive materials. Examples of suitable materials may include, without limitation, dielectrics, e.g., polytetrafluoroethylene (Teflon®), FR-4 (flame retardant 4), CEM-1 or CEM-3, low-loss dielectric PCB material, e.g., Rogers 4350, GETEK® or ARLON, electrically-conductive materials such as without limitation metal, e.g., copper foil, fibrous materials, e.g., carbon, graphite, graphene, glass, quartz, polyethylene or liquid crystal polymer fibers, prepreg materials, e.g., FR-2 (phenolic cotton paper), FR-3 (cotton paper and epoxy), FR-4 (woven glass and epoxy), FR-5 (woven glass and epoxy), FR-6 (matte glass and polyester), G-10 (woven glass and epoxy), CEM-1 (cotton paper and epoxy), CEM-2 (cotton paper and epoxy), CEM-3 (woven glass and epoxy), CEM-4 (woven glass and epoxy) or CEM-5 (woven glass and polyester), or other suitable electrically-conductive or non-conductive materials, e.g., fibrous materials with low coefficients of thermal expansion that are metalized to provide a resultant electrically-conductive material with a low coefficient of thermal expansion.

As it is used in this description, "electrically conductive", or simply "conductive", generally refers to materials that are capable of electrical conductivity, including, without limitation, materials that are highly conductive, e.g., metals, or semi-conductive, e.g., semi-conducting materials and composites As it is used in this description, "ground plane" refers to not only conductive planes which in operation are coupled to ground potential, but also conductive planes that may be coupled to other circuit potentials. Generally speaking, a ground plane is a relatively large plane of material having low electrical impedance. In implementations, it may actually be either a ground plane or a power plane (commonly referred to as reference planes).

Various embodiments of the presently-disclosed PCBs include at least one layer stack that includes an electrically-conductive layer (e.g., a ground plane or a power plane), an electrically-insulating layer (also referred to herein as an "insulative layer") and one or more cut-out areas defining a void that extends therethrough. In embodiments of the presently-disclosed PCBs, a variety of electrically-conductive traces (e.g., strip-line traces, microstrip traces, embedded microstrip traces, and/or combinations thereof) may be used in conjunction with one or more power planes to form transmission lines.

The presently-disclosed PCBs according to embodiments may be multi-layer PCBs that employ a variety of transmission lines, including, without limitation, strip-line configurations on internal layers of the PCB, e.g., providing power distribution, digital signal processing, and other functions, and/or microstrip configurations on external layers of the PCB.

Various embodiments of the presently-disclosed PCBs include one or more cut-out areas defined in at least one layer stack, and may provide strip-line shielding capability along with microstrip-like accessibility to add components on and off the circuit board and/or to perform other operations, e.g., testing. The presently-disclosed PCBs including one or more cut-out areas defined in one or more layer stacks may provide the capability to add or remove component capacitance to equalize the line.

Figure 17:
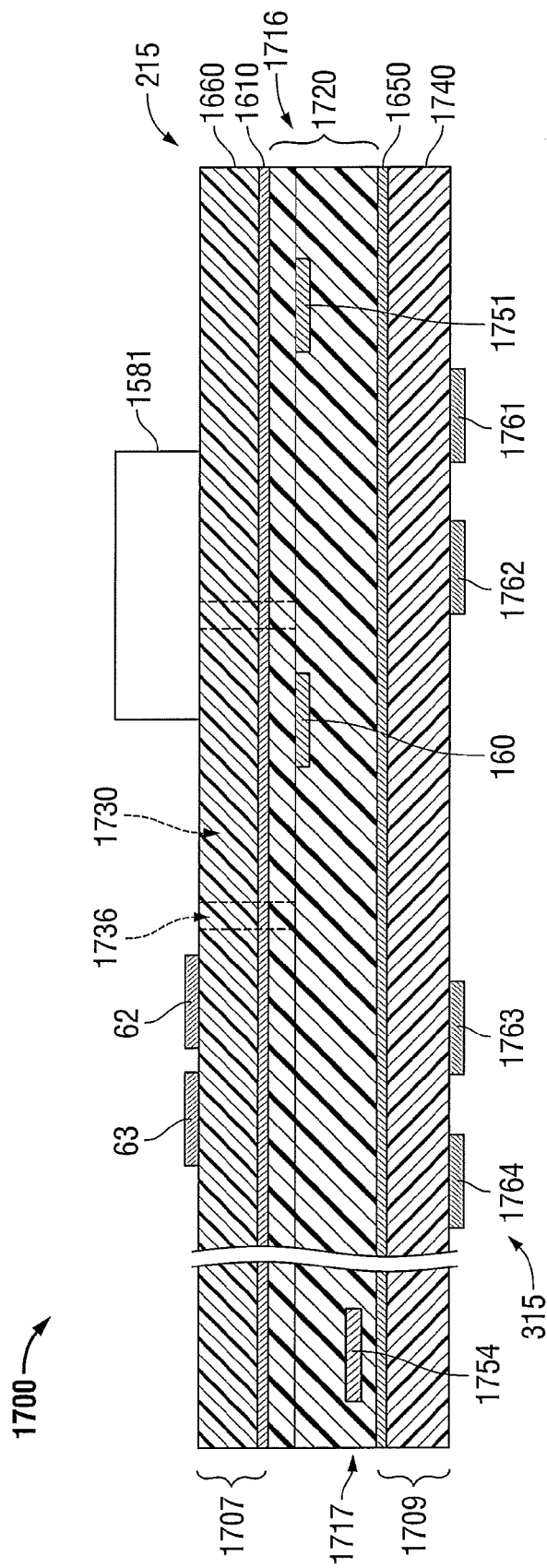
FIG. 17 is an enlarged, cross-sectional view of a portion of a PCB according to yet another embodiment of the present disclosure.

Although the following description describes the use of symmetric (balanced) strip-line construction in PCB embodiments including one or more cut-out areas defined in one or more layer stacks, the teachings of the present disclosure may also apply to asymmetric or offset (unbalanced) strip-line routing. A PCB embodiment that includes an asymmetric strip-line transmission line is shown in the cross-sectional view of FIG. 5. A multi-layer PCB embodiment including an asymmetric strip-line configuration is shown in FIG. 17.

Figure 3:
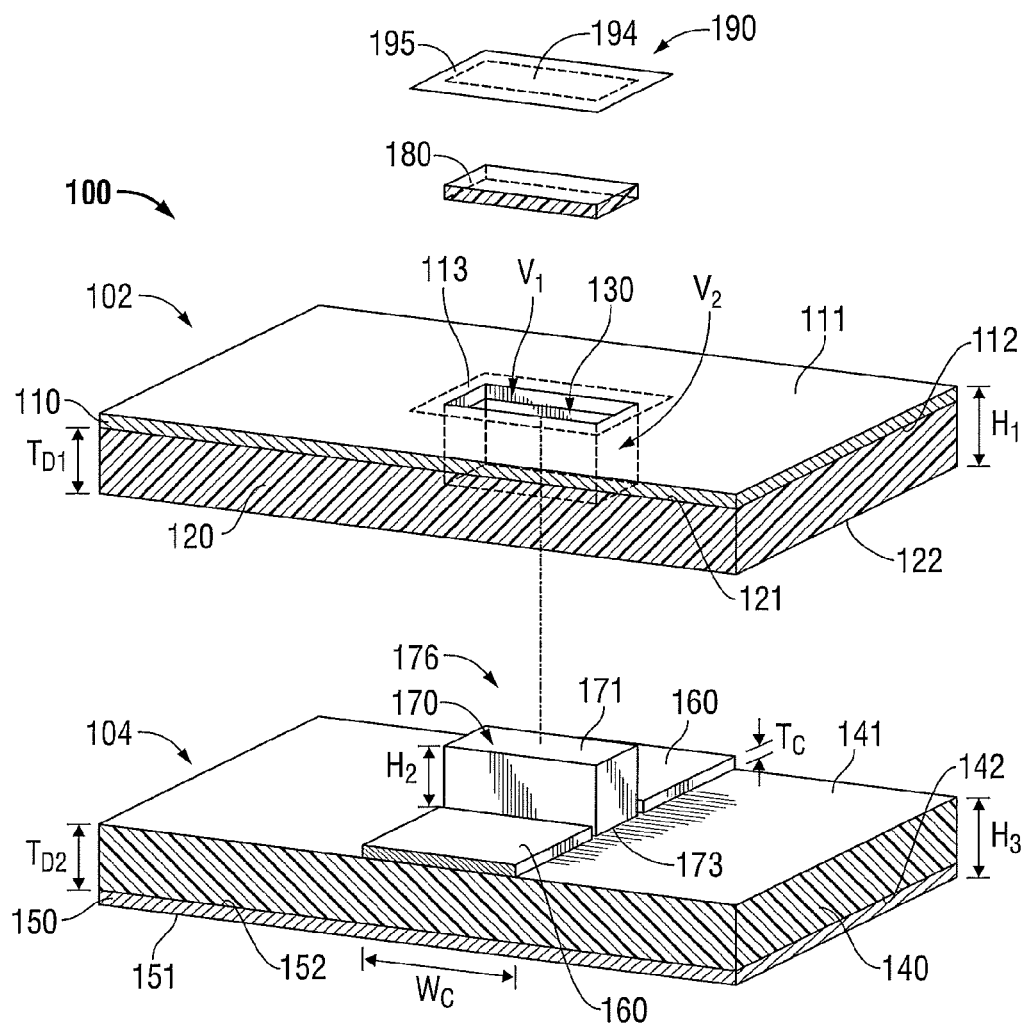
FIG. 3 is an enlarged, perspective, cross-sectional view of a portion of a PCB with layer stacks separated including a cut-out area defined in a first layer stack according to an embodiment of the present disclosure.

FIG. 3 shows a portion of a PCB 100 with first and second layer stacks separated according to an embodiment of the present disclosure. PCB 100 includes a first layer stack 102 and a second layer stack 104. First layer stack 102 includes a cut-out area 130 defined therethrough. Although only one cut-out area 130 is shown in FIG. 3 for ease of illustration, it is to be understood that PCB 100 may include any number of cut-out areas defined in the first layer stack 102 and/or the second layer stack 104. As shown in FIG. 3, the first layer stack 102 has a height "$H_1$". Height "$H_1$" may be any suitable height. First layer stack 102 generally includes a first conductive layer 110 and a first insulative layer 120 upon which the first conductive layer 110 is supported. In some embodiments, the first conductive layer 110 may be either a power plane or a ground plane.

Second layer stack 104 includes a second insulative layer 140. First insulative layer 120 and the second insulative layer 140 may include any suitable material configured to resist, or substantially resist, the flow of electricity and to provide physical support for, among other things, one or more conductive layers, electrical and/or electronic components, devices, connectors, etc. In some embodiments, the first insulative layer 120 and/or the second insulative layer 140 may include one or more layers of dielectric laminate.

As shown in FIG. 3, the first conductive layer 110 generally includes a first surface 111 and an opposite second surface 112. First conductive layer 110 may include a single layer or multiple layers disposed between the first and second surfaces 111 and 112, respectively. Second conductive layer 150 generally includes a first surface 151 and an opposite second surface 152. Second conductive layer 150 may include a single layer, or a plurality of layers, disposed between the first and second surfaces 151 and 152, respectively.

First insulative layer 120 generally includes a first surface 121 and an opposite second surface 122. First insulative layer 120 may include a single layer, or a plurality of layers, disposed between the first and second surfaces 121 and 122, respectively. First insulative layer 120 may have any suitable thickness "$T_{D1}$". Height "$H_2$" of the device 170 may be less than the thickness "$T_{D1}$" of the first insulative layer 120.

In some embodiments, the first conductive layer 110 may be deposited directly on, or coupled to, the first surface 121 of the first insulative layer 120. Alternatively, one or more layers (not shown) may be disposed between the second surface 112 of the first conductive layer 110 and the first surface 121 of the first insulative layer 120. In an alternative embodiment not shown, a sheet of thermally-responsive material may be disposed between the first surface 121 of the first insulative layer 120 and the second surface 112 of the first conductive layer 110, e.g., to form a laminated bond therebetween. In some embodiments, the first conductive layer 110 and the first insulative layer 120 are arranged in substantially parallel planes.

Figure 5:
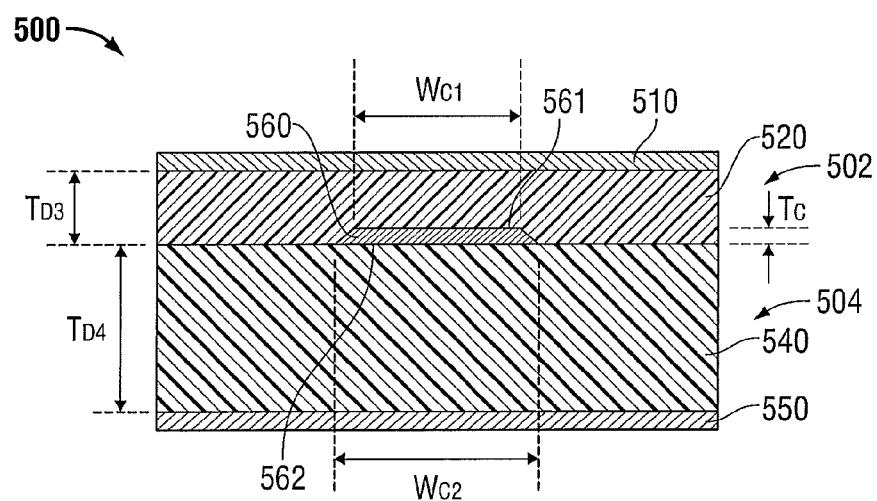
FIG. 5 is an enlarged, cross-sectional view of a PCB including an asymmetric strip-line transmission line according to an embodiment of the present disclosure.

In some embodiments, as shown in FIG. 3, a second conductive layer 150 and a circuit 176 are disposed on opposite sides of the second insulative layer 140. In some embodiments, the second conductive layer 150 may be either a power plane or a ground plane. Circuit 176 generally includes a device 170 and one or more electrically-conductive traces 160 disposed on the second insulative layer 140. Circuit 176 may include a collection of circuit elements, e.g., transistors, diodes, capacitors, and resistors, as well as signal lines and other conductors that interconnect these various circuit elements. Conductive traces 160 have a controlled width "$W_C$" and a thickness "$T_C$", and may be formed of any suitable electrically-conductive material, e.g., copper, gold, silver or other conductive metals having suitable conductivity values. Conductive traces of the circuit 176 may be characterized by a first width "$W_{C1}$" of an upper surface thereof and a second width "$W_{C2}$" of a lower surface, as shown in FIG. 5.

Device 170 may be electrically-coupled to one or more conductive traces 160. Device 170 may include any electrical device, electrical component, electronic device, electronic component, semiconductor component, etc. Device 170 may include any electrical connector, such as without limitation surface mount connectors in SMA, SMB, SMC, SSMB, and SSMC. In some embodiments, multiple electrical components may be assembled into the device 170, which itself may be used as a component. Device 170 may include active devices and/or passive devices. In some embodiments, the device 170 may be a capacitor.

Device 170 generally includes a top surface 171 and a bottom surface 173. Device 170 includes a height "$H_2$" defined between the top and bottom surfaces 171 and 173, respectively. Height "$H_2$" may be any suitable height. In some embodiments, the height "$H_2$" of the device 170 is less than the height "$H_1$" of the first layer stack 102. Device 170 may take a variety of shapes and sizes. For ease of explanation and understanding, the device 170 is shown as a single element having a rectangular shape.

First conductive layer 110 and the second conductive layer 150 may be formed of any suitable electrically-conductive material, e.g., copper, gold, silver or other conductive metals having suitable conductivity values. In some embodiments, the first conductive layer 110 and/or the second conductive layer 150 may be a conductive foil. Conductive materials that may be used to form the first conductive layer 110 and/or the second conductive layer 150 may be plated with other materials, e.g., other conductive materials such as gold or silver, to improve their properties, e.g., to improve electrical conductivity.

Second insulative layer 140 generally includes a first surface 141 and an opposite second surface 142. Second insulative layer 140 may include a single layer or multiple layers disposed between the first and second surfaces 141 and 142, respectively. Second insulative layer 140 may have any suitable thickness "$T_{D2}$". In some embodiments, the first insulative layer 120 is formed from a material with a dielectric constant different than the dielectric constant of the second insulative layer 140.

In some embodiments, the thickness "$T_{D1}$" of the first insulative layer 120 of the first layer stack 102 may be substantially equal to the thickness "$T_{D2}$" of the second insulative layer 140 of the second layer stack 104. Alternatively, the thickness "$T_{D1}$" of the first insulative layer 120 may be less than, or greater than, the thickness "$T_{D2}$" of the second insulative layer 140.

As best shown in FIG. 3, the first layer stack 102 includes a cut-out area 130 defining a void that extends from the second surface 122 of the first insulative layer 120 to the first surface 111 of the first conductive layer 110. The height of the cut-out area 130 is generally equal to the height "$H_1$" of the first layer stack 102. Cut-out area 130 according to embodiments is configured to receive at least a portion of the device 170 therein. Cut-out area 130 may take a variety of shapes and sizes.

In some embodiments, the void defined by the cut-out area 130 may include a first volume "$V_1$" of void space and a second volume "$V_2$" of void space. The first volume "$V_1$" of void space is defined between the top surface 171 of the device 130 and a plane (depicted by arrow-headed dotted lines in FIG. 4) containing the first surface 111 of the first electrically-conductive layer 110. The second volume "$V_2$" of void space is equal to the volume of the device 130, or portion thereof, to be disposed within the cut-out area 130.

Figure 4:
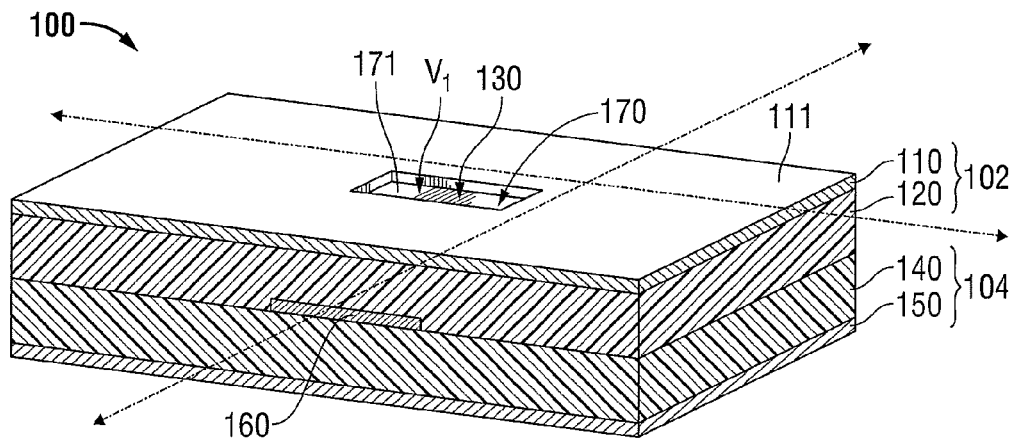
FIG. 4 is an enlarged, perspective, cross-sectional view of the PCB of FIG. 3 shown assembled with a device disposed in a first-level configuration within the cut-out area according to an embodiment of the present disclosure.

In FIG. 4, an assembled configuration of the PCB 100 is shown and includes the first layer stack 102 including the cut-out area 130 defined therethrough and the second layer stack 104 with the device 170 disposed in a first-level configuration within the cut-out area 130. As it is used in this description, with respect to the cut-out area 130, "first-level configuration" generally refers to varied configurations wherein the top surface 171 of the device 170 is disposed (e.g., in relation to the first conductive layer 110) below the level of the second surface 112 of the first conductive layer 110, such that the peripheral edges of the device 170 do not physically contact the first conductive layer 110. In other PCB embodiments, "first-level configuration" may be used in the context of other devices (e.g., device 1070 shown in FIGS. 10B, 10C and 11, and device 1370 shown in FIGS. 13 and 14).

In some embodiments, a dielectric material 180 (shown in FIG. 3) may be used to fill, entirely or in part, a volume of void space defined by the cut-out area 130 disposed above (e.g., extending outwardly from) the top surface 171 of the device 170. Dielectric material 180 may be any suitable material having any suitable dielectric constant.

Cut-out areas in accordance with the present disclosure (e.g., one cut-out area 130 shown in FIG. 3, or two cut-out areas 1303 and 1330 shown in FIG. 13) may be formed by any suitable process, e.g., laser cutting, stamping, punching and/or die-cutting, or any combination of these and other processes, e.g., photo-etching. In some embodiments, one or more cut-out areas may be formed by fineblanking, or a combination of fineblanking and forming operations.

Fineblanking may be used to achieve flatness and cut edge characteristics that may be unobtainable by conventional stamping and punching methods. In general, fineblanking operations require the use of high-pressure pads and are carried out on triple-action hydraulic presses on which the punch, guide plate, and die movements can be controlled individually or simultaneously. The pads hold the part flat during the cutting process and prevent the part from plastically deforming during punch entry. Using fineblanking, a part's cut surface is sheared smoothly over the entire workpiece thickness, with minimal die roll on edges. Achievable part dimensional tolerances may range from about +/−0.0003 inches to about +/−0.002 inches, depending upon material thickness, material characteristics (e.g., tensile strength), and part layout. The use of fineblanking processes allows excellent dimensional control, accuracy and repeatability throughout a production run.

In some embodiments, the cut-out area 130 may be characterized as including an outer periphery having a length and a width that is at least marginally larger than the length and width, respectively, of the device 170, e.g., to allow for ease of assembly of the PCB 100. In some embodiments, one or more surfaces of the first insulative layer 120 (and/or first conductive layer 110) disposed adjacent to the outer periphery of the cut-out area 130 may include one or more grooves, slots, pockets, channels or other recesses configured to accommodate and receive therein one or more portions of a device, and/or to allow for air circulation around the device, or portion thereof, to increase heat dissipation. Additionally, or alternatively, a configuration of gap areas, which are described later in this description, may be provided to the first layer stack 102, e.g., disposed in adjoining relation to the cut-out area 130, or portion thereof.

In some embodiments, the first electrically-conductive layer 110 of the first stack 102 may be formed, patterned or otherwise deposited on the surface of first insulative layer 120 to avoid or otherwise exclude one or more areas 113 disposed adjacent to the outer periphery of the cut-out area 130. Alternatively, one or more areas 113 of the surface of first insulative layer 120 may be exposed by removal of one or more portions of the first electrically-conductive layer 110.

As shown in FIG. 3, a sheet of electrically-conductive material 190 may be provided, and may include a first portion 194 configured to cover the cut-out area 130 when a second portion 195 of the sheet 190 is disposed on either, the first surface 111 of the first conductive layer 110, or the first surface 121 of the first insulative layer 120. Electrically-conductive material 190 may include various types of materials in varied configurations, including, without limitation, a conductive tape (e.g., carbon conductive tape or copper conductive tape) or a conductive adhesive sheet (e.g., silver conductive adhesive sheet). In some embodiments, the sheet of electrically-conductive material 190, or portion thereof (e.g., second portion 195), may be provided with a suitable adhesive material for affixing, permanently or releaseably, the sheet of electrically-conductive material 190, or portion thereof, to the first surface 111 of the first conductive layer 110 and/or the first surface 121 of the first insulative layer 120.

FIG. 5 shows a PCB 500 that includes an asymmetric strip-line transmission line according to an embodiment of the present disclosure. PCB 500 includes a first layer stack 502 and a second layer stack 504. First layer stack 502 includes a first conductive layer 510 and a first insulative layer 520 upon which the first conductive layer 510 is supported. Second layer stack 504 includes a second conductive layer 550 and a second insulative layer 540. An electrically-conductive trace 560 is sandwiched by the first and second insulative layers 520 and 540 disposed between the first and second conductive layers 510 and 550. First conductive layer 510 and second conductive layer 550 are similar to the first conductive layer 110 and the second conductive layer 150, respectively, shown in FIG. 3 and further description thereof is omitted in the interests of brevity.

First insulative layer 520 and the second portion second insulative layer 540 are similar to the first insulative layer 120 and the second insulative layer 140, respectively, of PCB 100 shown in FIG. 3, except for the thickness of the first insulative layer 520 in relation to the thickness of the second insulative layer 540. As shown in FIG. 5, the thickness "$T_{D3}$" of the first insulative layer 520 is less than the thickness "$T_{D4}$" of the second insulative layer 540. Electrically-conductive trace 560 may be disposed on the second insulative layer 540. Electrically-conductive trace 560 generally includes a thickness "$T_C$", an upper surface having a width "$W_{C1}$", and a lower surface having a width "$W_{C2}$".

Figure 6:
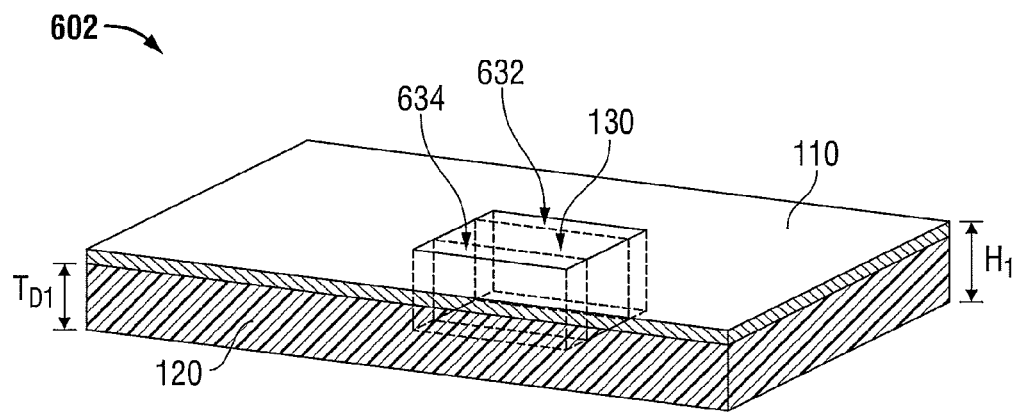
FIG. 6 is an enlarged, perspective, cross-sectional view of an embodiment of a first layer stack including the cut-out area of the PCB shown in FIG. 3 defined therethrough shown with a configuration of gap areas disposed along two opposite sides of the cut-out area according to the present disclosure.

FIG. 6 shows an embodiment of a first layer stack 602 including a cut-out area 130 defined therethrough in accordance with the present disclosure. First layer stack 602 generally includes the first conductive layer 110 and the first insulative layer 120 of the first layer stack 102 shown in FIG. 3. First layer stack 602 may have any suitable height "$H_1$".

Figure 8:
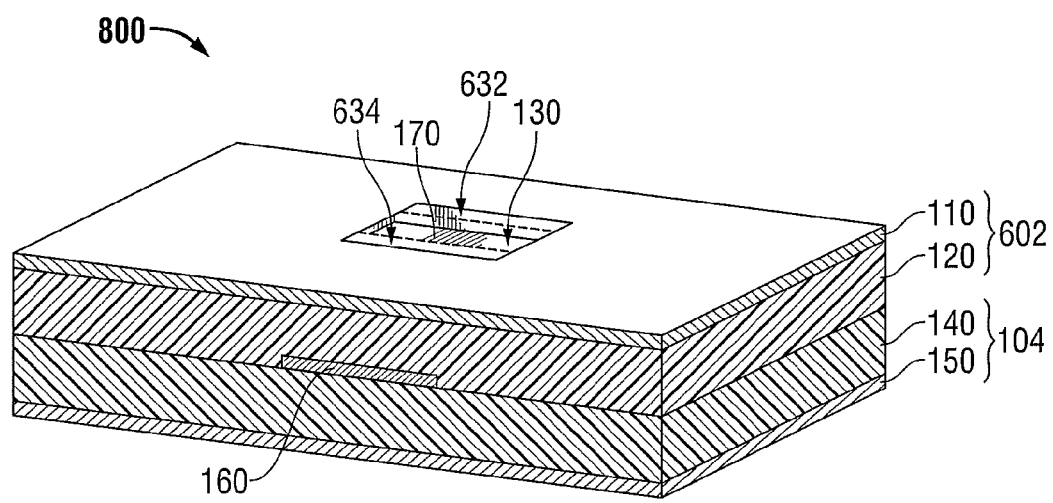
FIG. 8 is an enlarged, perspective, cross-sectional view of a portion of a PCB including the first layer stack of FIG. 6 and the second layer stack of FIG. 3 shown assembled with a device disposed in a first-level configuration within the cut-out area according to an embodiment of the present disclosure.

First layer stack 602 is similar to the first layer stack 102 shown in FIG. 3, except for a configuration of gap areas disposed along two opposite sides of the cut-out area 130, e.g., to simplify physical interconnections and assembly operations (e.g., component placement and soldering) and/or to facilitate inspection and test. As shown in FIGS. 6 and 8, the first layer stack 602 includes a first gap area 632 and a second gap area 634. First and second gap areas 632 and 634 disposed along two opposite sides of the cut-out area 130 may be configured to allow for removal of the device 170, e.g., to facilitate the replacement of parts and/or hardware upgrade, and/or to allow for air circulation for heat dissipation purposes. The shape, size and relative positions of the first and second gap areas 632 and 634, respectively, may be varied from the configuration depicted in FIGS. 6 and 8.

Figure 7:
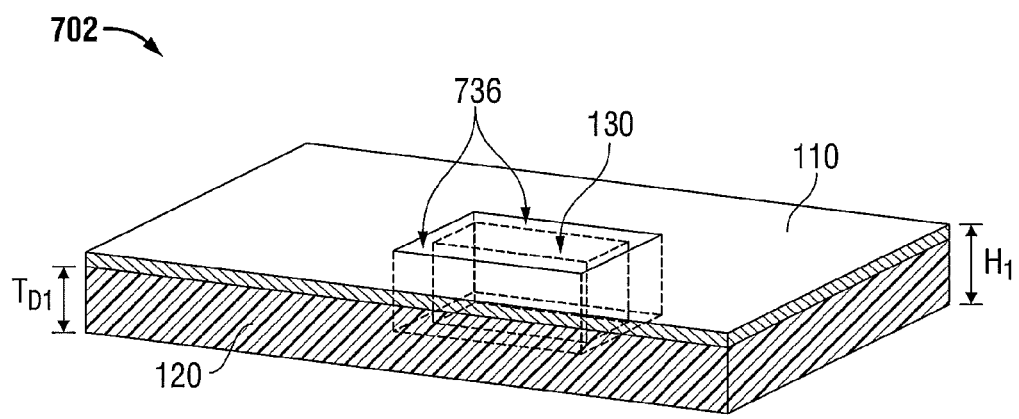
FIG. 7 is an enlarged, perspective, cross-sectional view of an embodiment of a first layer stack including the cut-out area of the PCB shown in FIG. 3 defined therethrough shown with a configuration of gap areas disposed around the outer periphery of the cut-out area according to the present disclosure.

FIG. 7 shows an embodiment of a first layer stack 702 including a cut-out area 130 defined therethrough in accordance with the present disclosure. First layer stack 702 generally includes the first conductive layer 110 and the first insulative layer 120 of the first layer stack 102 shown in FIG. 3. First layer stack 702 may have any suitable height "$H_1$".

Figure 9:
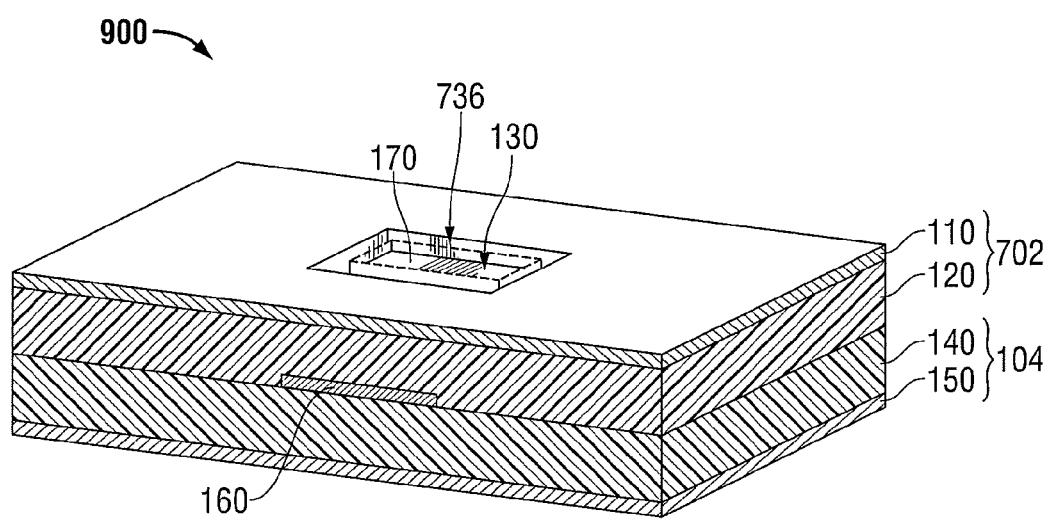
FIG. 9 is an enlarged, perspective, cross-sectional view of a portion of a PCB including the first layer stack of FIG. 7 and the second layer stack of FIG. 3 shown assembled with a device disposed in a first-level configuration within the cut-out area according to an embodiment of the present disclosure.

First layer stack 702 is similar to the first layer stack 102 of PCB 100 shown in FIG. 3, except for a gap area disposed in association with the cut-out area 130. As shown in FIGS. 7 and 9, the first layer stack 702 includes a gap area 736 disposed around the outer periphery of the cut-out area 130, e.g., to optimize ease and economy of assembly, inspection, test, and acceptance of components, and/or to enhance electrical isolation of the device 170 from the first conductive layer 110. The shape and size of the gap area 736 may be varied from the configuration depicted in FIGS. 7 and 9.

FIG. 8 shows a portion of a PCB 800 according to an embodiment of the present disclosure. In FIG. 8, the first layer stack 602 of FIG. 6 including the cut-out area 130 defined therethrough and the second layer stack 104 of FIG. 3 are shown assembled with the device 170 disposed in a first-level configuration within the cut-out area 130.

FIG. 9 shows a portion of a PCB 900 according to an embodiment of the present disclosure. In FIG. 9, the first layer stack 702 of FIG. 7 including the cut-out area 130 defined therethrough and the second layer stack 104 of FIG. 3 are shown assembled with the device 170 disposed in a first-level configuration within the cut-out area 130.

Figure 10A:
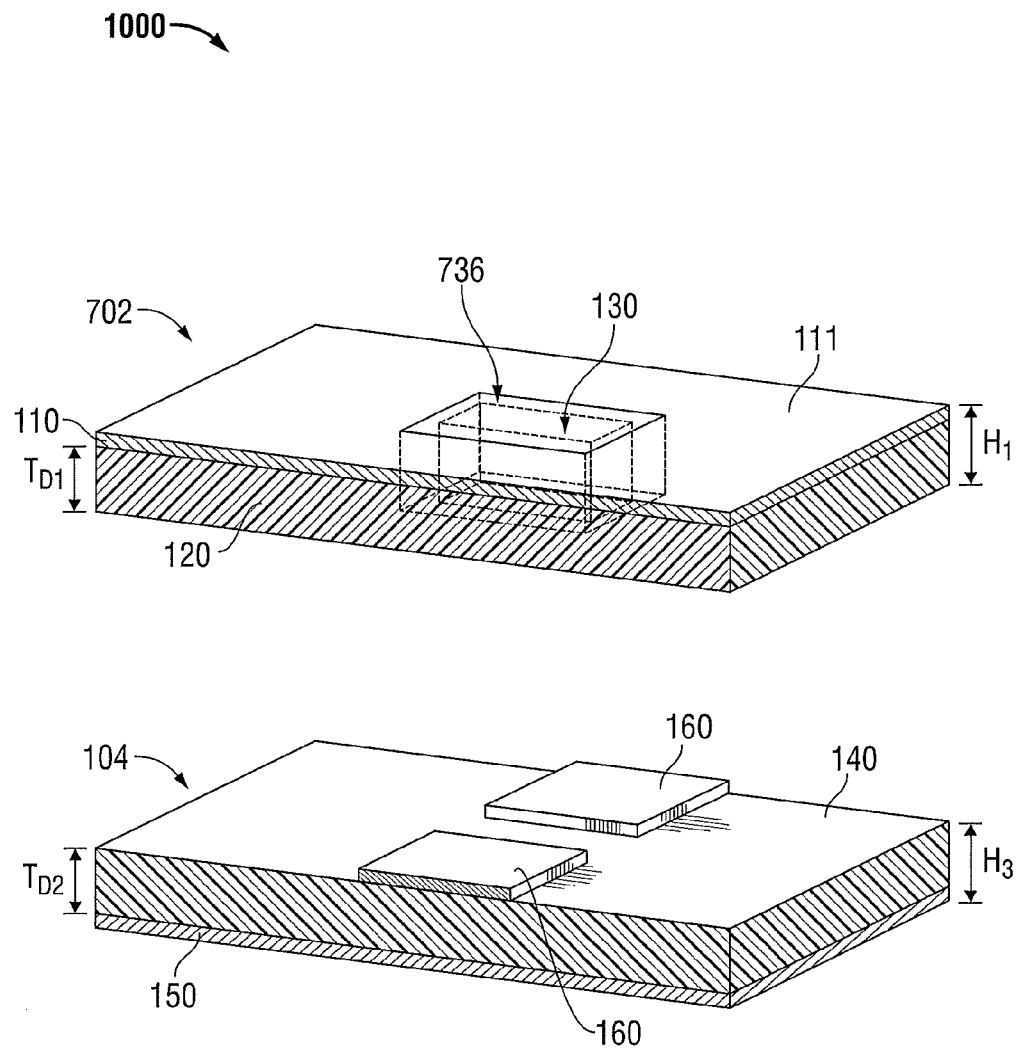
FIG. 10A is an enlarged, perspective, cross-sectional view of a portion of a PCB with layer stacks separated that includes the first layer stack of FIG. 7 shown with the cut-out and gap areas defined therethrough and the second layer stack of FIG. 3 shown with a portion of a conductor line disposed thereon according to an embodiment of the present disclosure.

FIG. 10A shows a portion of a PCB 1000 with first and second layer stacks separated according to an embodiment of the present disclosure. PCB 1000 generally includes the first layer stack 702 of FIG. 7 and the second layer stack 104 of FIG. 3. First layer stack 702 has any suitable height "$H_1$". First layer stack 702 includes the cut-out area 130 defined therethrough and the gap area 736 surrounding the cut-out area 130. One or more electrically-conductive traces 160 are disposed (e.g., formed, patterned or otherwise deposited) on the second insulative layer 140 of the second layer stack 104. Second layer stack 104 has any suitable height "$H_3$".

Figure 10B:
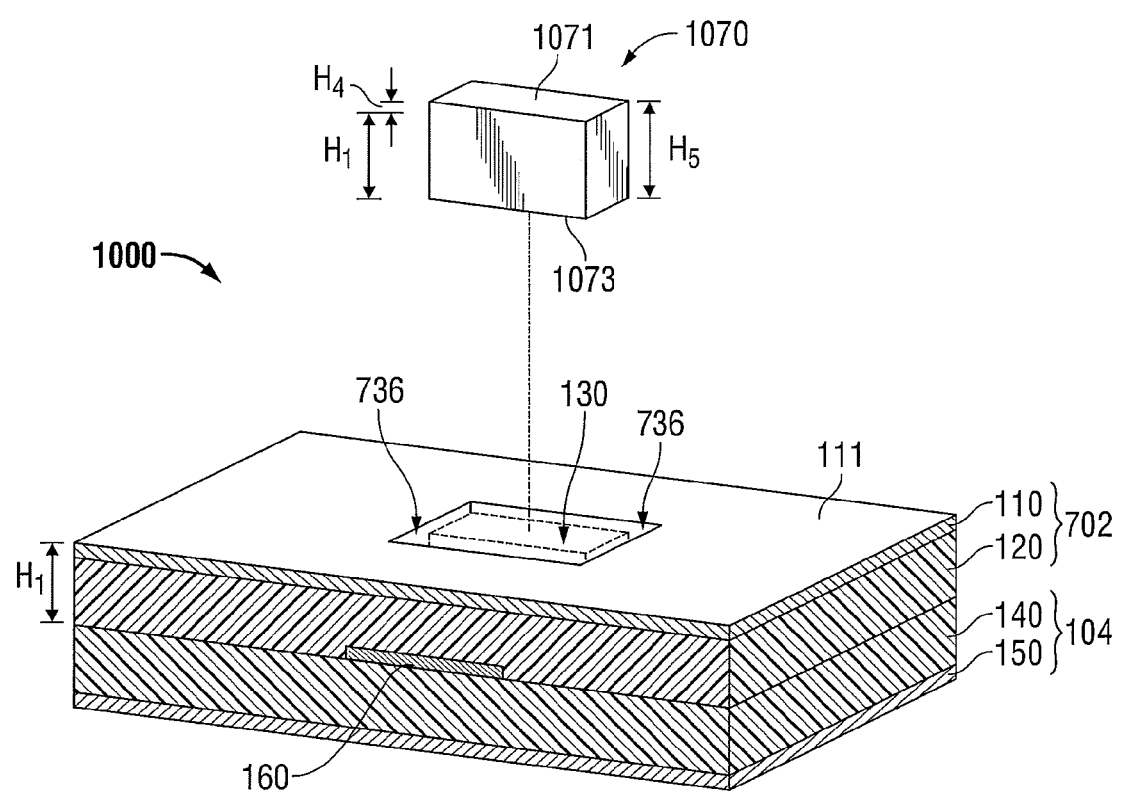
FIG. 10B is an enlarged, perspective, cross-sectional view of the PCB of FIG. 10A shown with a device positioned for placement onto the second layer stack through the cut-out area of the first layer stack according to an embodiment of the present disclosure.

In FIG. 10B, the first layer stack 702 and second layer stack 104 are shown assembled with a device 1070 positioned above the first layer stack 702 for placement into the cut-out area 130 onto the second layer stack 104 according to an embodiment of the present disclosure. Device 1070 generally includes a top surface 1071 and a bottom surface 1073. Device 1070 includes a height "$H_5$" defined between the top and bottom surfaces 1071 and 1073, respectively. Height "$H_5$" may be any suitable height.

Figure 10C:
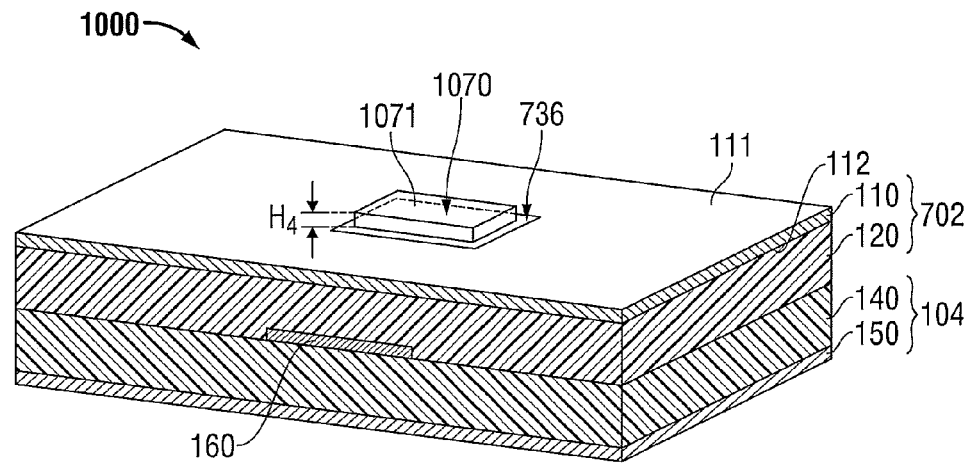
FIG. 10C is an enlarged, perspective, cross-sectional view of the PCB of FIG. 10B shown assembled with a device disposed in a second-level configuration within the cut-out area according to an embodiment of the present disclosure.

Device 1070 shown in FIGS. 10B and 10C is similar to the device 170 of FIG. 3, except for the height "$H_5$" of the device 1070, which is greater than the height "$H_3$" of the device 170 of FIG. 3, by a height "$H_4$". Device 1070 may take a variety of shapes and sizes. In some embodiments, the device 1070 may be mounted, or otherwise disposed on, or adjacent to, the second insulative layer 140 of the second layer stack 104. Device 1070 may be electrically-coupled to one or more electrically-conductive traces 160 disposed in association with the second insulative layer 140.

In FIG. 10C, the PCB 1000 of FIG. 10B is shown with the device 1070 disposed in a second-level configuration. As it is used in this description, "second-level configuration", with respect to the device 1070, generally refers to varied configurations wherein a first portion of the device 1070 is disposed within a cut-out area (e.g., cut-out area 1303 shown in FIGS. 13 and 14) and a second portion including the top surface 1071 is disposed (e.g., in relation to the first conductive layer 110) outwardly of the first surface 111 and/or the second surface 112 of the first conductive layer 110. In other PCB embodiments, "second-level configuration" may be used with respect to other devices (e.g., device 170 shown in FIGS. 3, 4, 8, 9, 12, 13, 14 and 15, device 1070 shown in FIGS. 10B, 100 and 11, and device 1370 shown in FIGS. 13 and 14).

As shown in FIG. 100, the top surface 1071 of the device 1070 extends a height "$H_4$" above the first surface 111 of the first conductive layer 110, wherein the gap area 736 is configured such that the peripheral edges of the device 1070 do not physically contact the first conductive layer 110, e.g., to electrically isolate the device 1070 from the first conductive layer 110.

Figure 11:
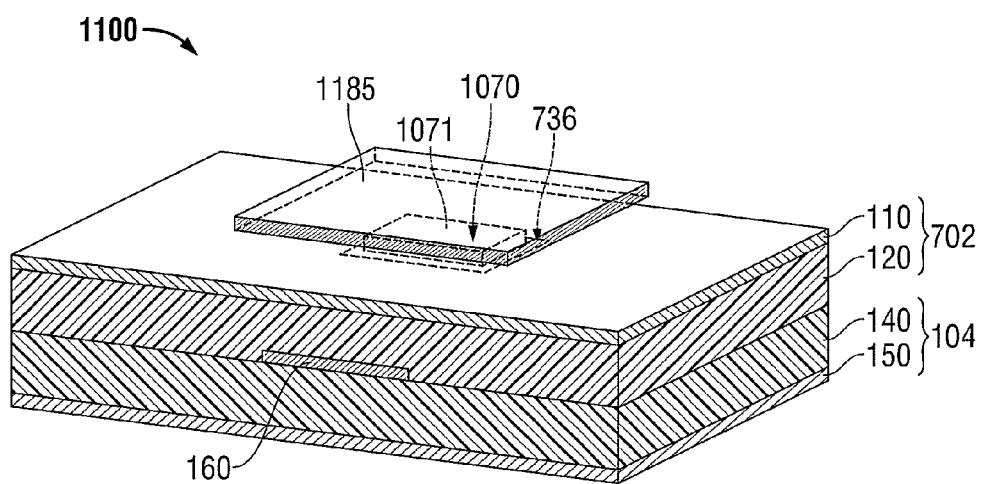
FIG. 11 is an enlarged, perspective, cross-sectional view of the PCB of FIG. 10C shown with a portion of a heat sink layer according to an embodiment of the present disclosure.

FIG. 11 shows a PCB 1100 according to an embodiment of the present disclosure that includes the PCB 1000 shown in FIG. 10C. PCB 1100 includes, or is otherwise associated with, a heat sink 1185. Heat sink 1185 may include one or more heat transfer layers capable of absorbing heat from an object. Heat sink 1185 may be a fluid-cooled heat sink. Heat sink 1185 may include integral sensing elements, and may be used as part of a system to provide a controlled temperature to one or more devices (e.g., device 1070 shown in FIG. 11).

As shown in FIG. 11, at least a portion of the heat sink 1185 is disposed in association with the top surface 1071 of the device 1070. In some embodiments, the heat sink 1185, or portion thereof, may be disposed on a portion of the top surface 1071, or relatively near the top surface 1071 of the device 1070.

Figure 12:
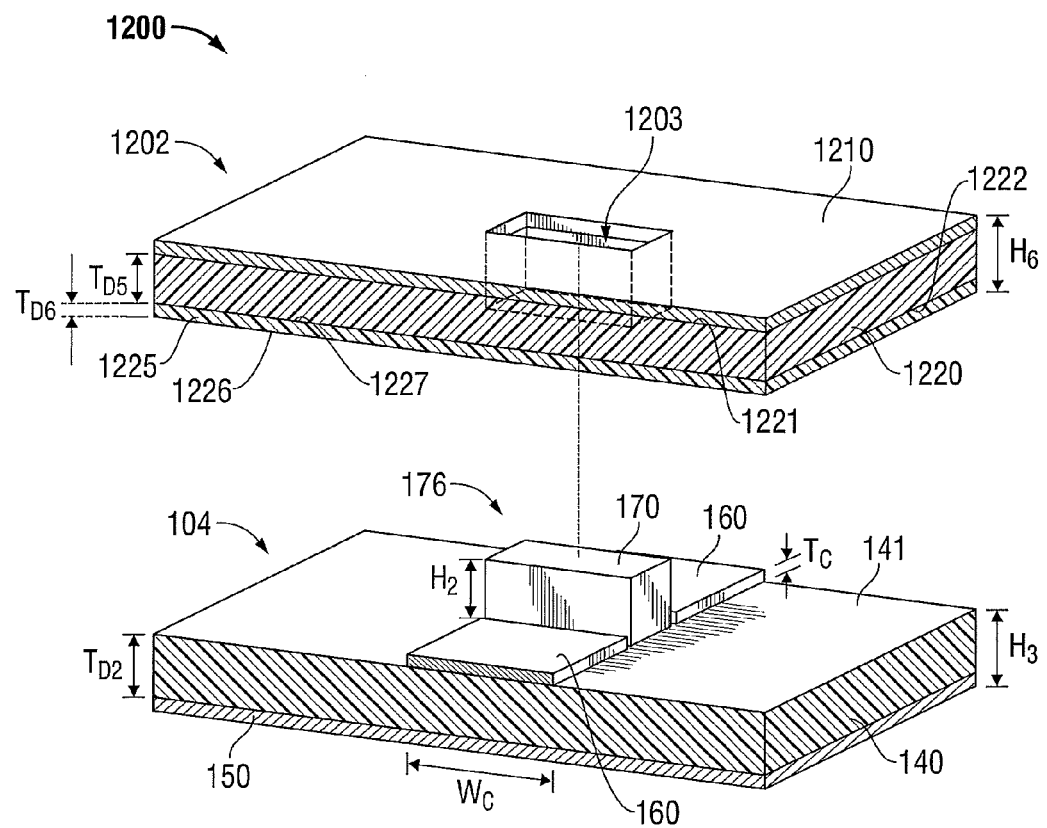
FIG. 12 is an enlarged, perspective, cross-sectional view of a portion of a PCB with layer stacks separated including another embodiment of a first layer stack including a cut-out area defined therethrough and the second layer stack of FIG. 3 according to the present disclosure.

FIG. 12 shows a portion of a PCB 1200 with first and second layer stacks separated according to an embodiment of the present disclosure. PCB 1200 includes a first layer stack 1202 and the second layer stack 104 shown in FIG. 3. First layer stack 1202 has a height "$H_6$" and generally includes a first conductive layer 1210, a first insulative layer 1220, a prepreg layer 1225, and a cut-out area 1203 defined therethrough. First layer stack 1202 may have any suitable height "$H_6$". First conductive layer 1210 is similar to the first conductive layer 110 shown in FIG. 3 and further description thereof is omitted in the interests of brevity.

First insulative layer 1220 may be formed from any suitable dielectric or insulating material. First insulative layer 1220 generally includes a first surface 1221 and an opposite second surface 1222. First insulative layer 1220 may include a single layer or multiple layers disposed between the first and second surfaces 1221 and 1222, respectively. First insulative layer 1220 may have any suitable thickness "$T_{D5}$". In some embodiments, the first insulative layer 1220 of the first layer stack 1202 is formed from a material with a dielectric constant different than the dielectric constant of the second insulative layer 140 of the second layer stack 104. In some embodiments, the height "$H_6$" of the first layer stack 1202 may be substantially equal to the height "$H_3$" of the second layer stack 104.

Prepreg layer 1225 has a thickness "$T_{D6}$" and generally includes a first surface 1227 and an opposite second surface 1226. In some embodiments, as shown in FIG. 12, the first surface 1227 of the prepreg layer 1225 is coupled to the second surface 1222 of the first insulative layer 1220 of the first layer stack 1202. In an alternative embodiment not shown, a prepreg layer may additionally, or alternatively, be coupled to the first surface 141 of the second insulative layer 120 of the second layer stack 104. Thickness "$T_{D6}$" may be any suitable thickness.

Prepreg layer 1225 may be formed from any suitable material. In some embodiments, the prepreg layer 1225 may include one or more layers of FR-2, FR-3, FR-4, FR-5, FR-6, G-10, CEM-1, CEM-2, CEM-3, CEM-4, CEM-5, and/or any suitable epoxy resin composition, fiber-reinforced composite material, and/or other suitable material disposed between the first and second surfaces 1227 and 1226, respectively.

Figure 13:
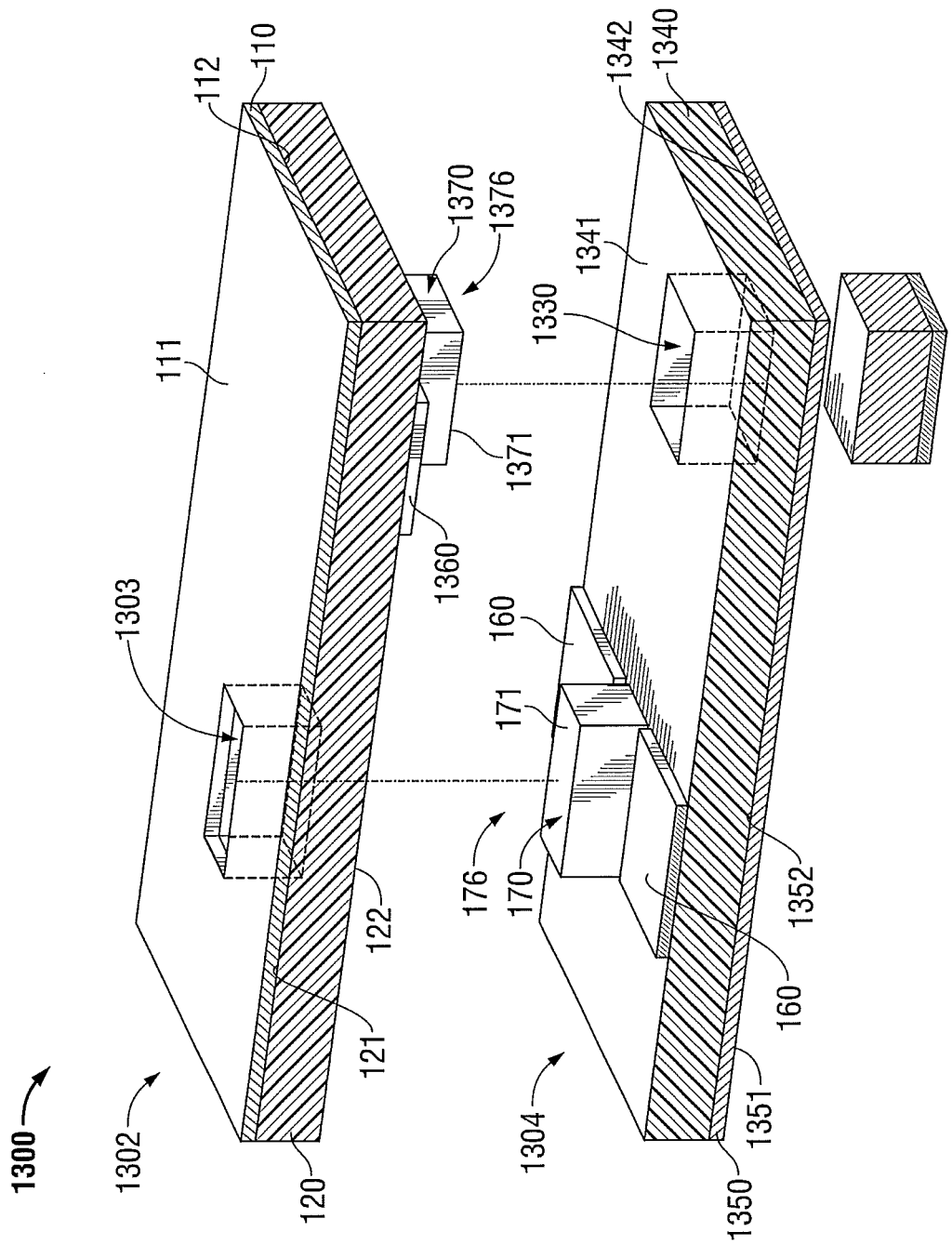
FIG. 13 is an enlarged, perspective, cross-sectional view of a portion of a PCB with layer stacks separated including a first cut-out area defined in a first layer stack and a second cut-out area defined in a second layer stack according to an embodiment of the present disclosure.

FIG. 13 shows a portion of a PCB 1300 with first and second layer stacks separated according to an embodiment of the present disclosure. PCB 1300 includes a first cut-out area 1303 defined in a first layer stack 1302, and a second cut-out area 1330 defined in a second layer stack 1304. Although only two cut-out areas 1303 and 1330 are shown in FIG. 13 for ease of illustration, it is to be understood that PCB 1300 may include any number of cut-out areas defined in the first layer stack 1302 and/or the second layer stack 1304.

First layer stack 1302 includes the first conductive layer 110 and the first insulative layer 120 shown in FIG. 3. First conductive layer 110 includes a first surface 111 and an opposite second surface 112. First insulative layer 120 includes a first surface 121 and an opposite second surface 122. In some embodiments, the first conductive layer 110 may be either a power plane or a ground plane.

As shown in FIG. 13, a circuit 1376 is disposed in association with the second surface 122 of the first insulative layer 120 of the first layer stack 1302. Circuit 1376 generally includes a device 1370 and one or more electrically-conductive traces 1360 disposed (e.g., formed, patterned, or otherwise deposited) on the second surface 122 of the first insulative layer 120. Circuit 1376 is similar to the circuit 176 shown in FIG. 3 and further description thereof is omitted in the interests of brevity.

Second layer stack 1304 includes a second insulative layer 1340. Second insulative layer 1340 generally includes a first surface 1341 and an opposite second surface 1342. Second insulative layer 1340 may include a single layer, or a plurality of layers, of any suitable dielectric or insulating material disposed between the first and second surfaces 1341 and 1342, respectively. Circuit 176 is disposed in association with the first surface 1341 of the second insulative layer 1340. In some embodiments, as shown in FIG. 13, a second conductive layer 1350 is supported by the second surface 1342 of the second insulative layer 1340. Second conductive layer 1350 generally includes a first surface 1351 and an opposite second surface 1352. In an alternative embodiment not shown, one or more layers of any suitable material may be disposed between the second surface 1342 of the second insulative layer 1340 and the second surface 1352 of the second conductive layer 1350, e.g., to form a bond therebetween. In some embodiments, the second conductive layer 1350 may be either a power plane or a ground plane.

As shown in FIG. 13, the cut-out area 1303 defines a void that extends from the second surface 122 of the first insulative layer 120 to the first surface 111 of the first conductive layer 110 of the first layer stack 1302. Cut-out area 1303 is configured to receive at least a portion of the device 170 therein. In some embodiments, when the second surface 122 of the first insulative layer 120 is coupled to the first surface 1341 of the second insulative layer 1340, the device 170 may be disposed in a first-level configuration within the cut-out area 1303, wherein the top surface 171 of the device 170 is disposed below the level of the second surface 112 of the first conductive layer 110, such that the peripheral edges of the device 170 do not physically contact the first conductive layer 110. In some embodiments, when the second surface 122 of the first insulative layer 120 is coupled to the first surface 1341 of the second insulative layer 1340, the top surface 171 of the device 170 is disposed below the second surface 112 of the first insulative layer 140. In some embodiments, a dielectric material (e.g., dielectric material 180 shown in FIG. 3) may be used to fill, entirely or in part, a volume of void space (e.g., void space "$V_1$" shown in FIG. 3) defined by the cut-out area 1303 disposed above, or extending outwardly from, the top surface 171 of the device 170.

In some embodiments, as shown in FIG. 13, the cut-out area 1330 defines a void that extends from the second surface 1342 of the second insulative layer 1340 to the first surface 1351 of the second conductive layer 1350 of the second layer stack 1304. Cut-out area 1303 is configured to receive at least a portion of the device 1370 therein. In some embodiments, when the second surface 122 of the first insulative layer 120 is coupled to the first surface 1341 of the second insulative layer 1340, the device 1370 may be disposed in a first-level configuration within the cut-out area 1303, wherein the top surface 1371 of the device 1370 is disposed below the level of the first surface 1351 of the second conductive layer 1350, e.g., the top surface 1371 of the device 1370 does not extend beyond the second surface 1342 of the second insulative layer 1340.

Cut-out areas 1303 and 1330 may be formed by any suitable process, e.g., laser cutting, stamping, punching and/or die-cutting, or any combination of these and other processes, e.g., photo-etching. In some embodiments, the cut-out area 1303 defined in the first layer stack 1302 and/or the cut-out area 1330 defined in the second layer stack 1304 may be formed by fineblanking, or a combination of fineblanking and forming operations. After fineblanking (or laser cutting, stamping, punching, die-cutting, etc.), one or more cut-out portions 1380 from the first layer stack 1302 and/or the second layer stack 1304 (e.g., cut-out portion 1380 associated with the cut-out area 1330) may be retained so as to be available for use as replacement material for filling any volume of void space defined by one or more cut-out areas, e.g., cut-out area 1303 and/or the cut-out area 133, and/or for minimizing discontinuity in a ground plane (or power plane).

In some cases, one or more cut-out areas defined through the first layer stack 1302 and/or the second layer stack 1304 may not be utilized during PCB assembly (or, later, a component may be removed from the PCB 1300). In cases such as those, the retained cut-out portions 1380 may be used as replacement material, e.g., to close the opening in the ground plane (or power plane) defined by the cut-out area, thereby minimizing discontinuity in the ground plane (or power plane), e.g., to avoid degrading electrical performance.

In some embodiments, one or more gap areas (e.g., first gap area 632 and/or second gap area 634 shown in FIG. 6, or gap area 736 shown in FIG. 7) disposed in adjoining relation to the cut-out area 1303 may be provided to the first layer stack 1302. In some embodiments, when the second surface 122 of the first insulative layer 120 of the first layer stack 1302 is coupled to the first surface 1341 of the second insulative layer 1340 of the second layer stack 1304, the device 170 may be disposed in a second-level configuration, wherein a first portion of the device 170 is disposed within the cut-out area 1303 and a second portion including the top surface 171 of the device 170 is disposed (e.g., in relation to the first conductive layer 110) outwardly of the first surface 111 and/or the second surface 112 of the first conductive layer 110.

One or more gap areas (e.g., first gap area 632 and/or second gap area 634 shown in FIG. 6, or gap area 736 shown in FIG. 7) disposed in adjoining relation to the cut-out area 1330 may additionally, or alternatively, be provided to the second layer stack 1304. In some embodiments, when the second surface 122 of the first insulative layer 120 of the first layer stack 1302 is coupled to the first surface 1341 of the second insulative layer 1340 of the second layer stack 1304, the device 1370 may be disposed in a second-level configuration, wherein a first portion of the device 1370 is disposed within the cut-out area 1330 and a second portion including the top surface 1371 of the device 1370 is disposed (e.g., in relation to the second conductive layer 1350) outwardly of the first surface 1351 and/or the second surface 1352 of the second conductive layer 1350.

Figure 14:
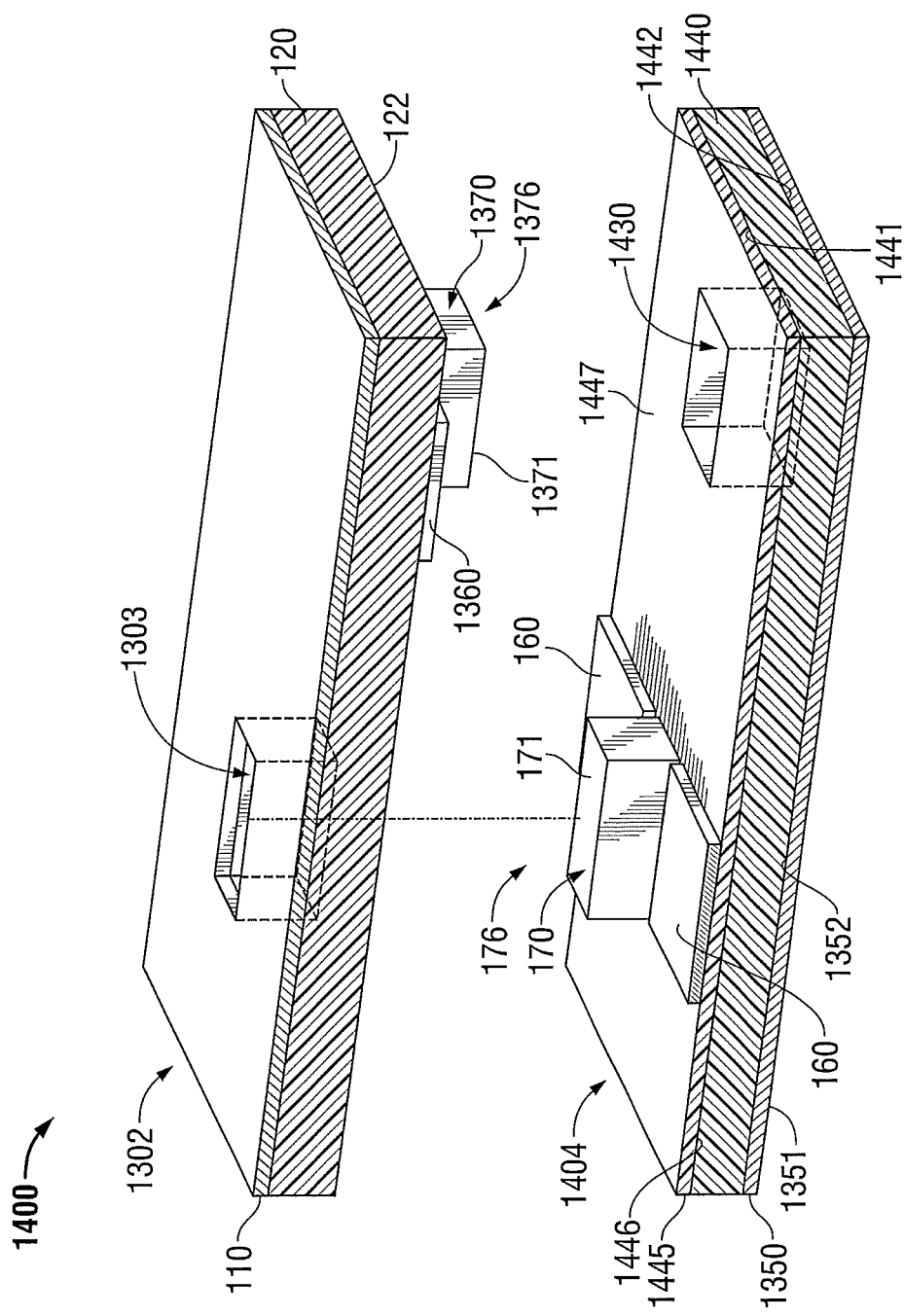
FIG. 14 is an enlarged, perspective, cross-sectional view of a portion of a PCB with layer stacks separated including the first layer stack of FIG. 13 and another embodiment of a second layer stack including a cut-out area defined therethrough according to the present disclosure.

FIG. 14 shows a portion of a PCB 1400 with layer stacks separated according to an embodiment of the present disclosure. PCB 1400 includes the first layer stack 1302 shown FIG. 13 including the first cut-out area 1303 defined therethrough and the circuit 1376. PCB 1400 includes a second layer stack 1404 including a second cut-out area 1430 defined therethrough. Although only two cut-out areas 1303 and 1430 are shown in FIG. 14 for ease of illustration, it is to be understood that PCB 1400 may include any number of cut-areas defined in the first layer stack 1302 and/or the second layer stack 1404.

Second layer stack 1404 includes a second insulative layer 1440. Second insulative layer 1440 generally includes a first surface 1441 and an opposite second surface 1442. Second insulative layer 1440 may include a single layer, or a plurality of layers, of any suitable dielectric or insulating material disposed between the first and second surfaces 1441 and 1442, respectively. In some embodiments, the second layer stack 1404 includes a second conductive layer 1450 including a first surface 1451 and an opposite second surface 1452. In some embodiments, as shown in FIG. 14, second surface 1452 of the second conductive layer 1450 is disposed on the second surface 1442 of the second insulative layer 1440. In an alternative embodiment not shown, one or more layers of any suitable material may be disposed between the second surface 1442 of the second insulative layer 1440 and the second surface 1452 of the second conductive layer 1450, e.g., to form a bond therebetween. In some embodiments, the second conductive layer 1450 may be either a power plane or a ground plane.

Second layer stack 1404 includes a prepreg layer 1445 disposed in association with the second insulative layer 1440. Prepreg layer 1445 generally includes a first surface 1447 and an opposite second surface 1446. In some embodiments, as shown in FIG. 14, second surface 1446 of the prepreg layer 1445 is disposed on the first surface 1441 of the second insulative layer 1440. Circuit 176 may be disposed in association with the first surface 1447 of the prepreg layer 1445. second conductive layer 1350 of FIG. 13 disposed on a first surface 1441 of a second insulative layer 1440, a prepreg layer 1445 disposed on an opposite second surface 1442 of the second insulative layer 1440, and a cut-out area 1430 defined therethrough.

As shown in FIGS. 13 and 14, the first layer stack 1302 includes a circuit 1376 disposed in association with a first insulative layer 120. Circuit 1376 generally includes a device 1370 and one or more strip-lines 1360 disposed on a second surface 122 of the first insulative layer 120. Cut-out area 1430 defined in the second layer stack 1404 is configured to receive at least a portion of the device 1370 therein.

In some embodiments, the second conductive layer 1350 may be either a power plane or a ground plane. Second insulative layer 1440 may include a single layer, or a plurality of layers, of any suitable dielectric or insulating material disposed between the first and second surfaces 1441 and 1442, respectively. Second insulative layer 1440 is similar to the second insulative layer 1340 of FIG. 13 and further description thereof is omitted in the interests of brevity.

Prepreg layer 1445 generally includes a first surface 1447 and an opposite second surface 1446. In some embodiments, as shown in FIG. 14, the second surface 1446 of the prepreg layer 1445 is disposed on the first surface 1441 of the second insulative layer 1440 of the second layer stack 1404. Prepreg layer 1445 is similar to the prepreg layer 1225 shown in FIG. 12 and further description thereof is omitted in the interests of brevity. In an alternative embodiment not shown, the first layer stack 1302 may additionally, or alternatively, include a prepreg layer, e.g., a prepreg layer (not shown) may be disposed on the second surface 122 of the first insulative layer 120 of the first layer stack 1302.

PCB 1400 may employ the dielectric material 180 and/or one or more sheets of electrically-conductive material 190 of the PCB embodiment shown in FIG. 3. In some embodiments, dielectric material 180 (FIG. 3) may be used to at least partially fill the void defined by the cut-out area 1303. In some embodiments, dielectric material 180 may additionally, or alternatively, be used to at least partially fill the void defined by the cut-out area 1430 shown in FIG. 14.

In some embodiments, a first sheet of electrically-conductive material 190 (FIG. 3) may additionally, or alternatively, be disposed over the cut-out area 1303 of the first layer stack 1302 shown in FIG. 14. Additionally, or alternatively, a second sheet of electrically-conductive material 190 may be disposed over the cut-out area 1430 of the second layer stack 1404 shown in FIG. 14.

It is to be understood that the configuration of layers between the circuit 1376 and the first conductive layer 110 of the first layer stack 1302, and the configuration of layers between the circuit 176 and the second conductive layer 1350 of the second layer stack 1404, are merely illustrative and non-limiting examples of layer stack-ups, and that PCB layer stacks including a conductive layer (e.g., ground or power plane) and one or more cut-out areas (e.g., two cut-out areas 1303 and 1430 shown in FIG. 14) defined therethrough according to embodiments of the present disclosure may utilize many different configurations of layer stack-ups, some with fewer, or additional, layers than depicted in the first and second layer stacks of FIG. 14.

Figure 15:
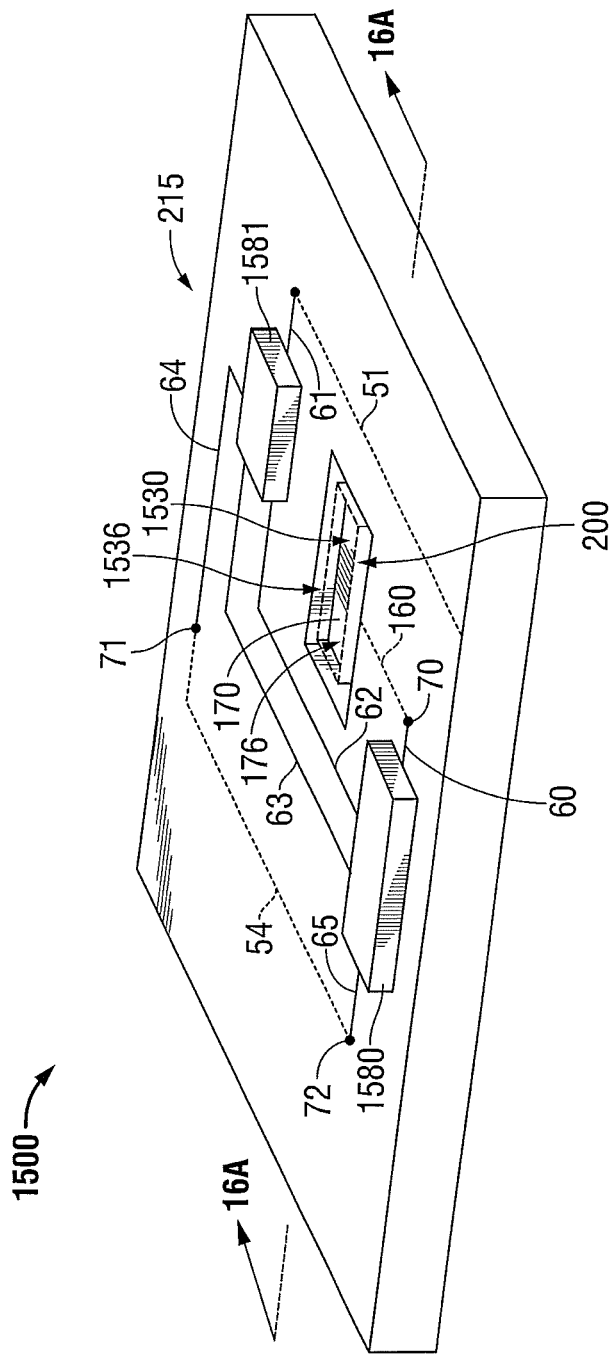
FIG. 15 is a schematic, enlarged, perspective view of a portion of a PCB according to another embodiment of the present disclosure.

FIGS. 15 and 16A show a portion of a PCB 1500 according to an embodiment of the present disclosure. PCB 1500 includes a first layer stack 1603. First layer stack 1603 includes a first insulative layer 1620 and a first conductive layer 1610. First layer stack 1603 may include one or more cut-out areas (e.g., cut-out area 1530) defined therethrough. In some embodiments, the first conductive layer 1610 may be a power plane or a ground plane. First insulative layer 1620 and the first conductive layer 1610 are similar to the first insulative layer 120 and the first conductive layer 110, respectively, of the first stack layer 102 shown in FIG. 3 and further description thereof is omitted in the interests of brevity.

PCB 1500 includes a second layer stack 1604. Second layer stack 1604 includes a second insulative layer 1640 and a second conductive layer 1650. In some embodiments, the second conductive layer 1650 may be a power plane or a ground plane. Second insulative layer 1640 and the second conductive layer 1650 are similar to the second insulative layer 140 and the second conductive layer 150, respectively, of the second stack layer 104 shown in FIG. 3 and further description thereof is omitted in the interests of brevity. In an alternative embodiment not shown, the second layer stack 1604 includes one or more cut-out areas defined therethrough.

In some embodiments, as shown in FIG. 16A, first layer stack 1603 includes a third insulative layer 1660 disposed in association with the first conductive layer 1610. Third insulative layer 1660 may include a single layer, or a plurality of layers, of any suitable dielectric or insulating material. A prepreg layer and/or other suitable material (not shown) may be disposed between the third insulative layer 1660 and the first conductive layer 1610, e.g., to form a bond therebetween. In an alternative embodiment not shown, the third insulative layer 1660 may be disposed in association with the second conductive layer 1650.

PCB 1500 includes a first signal layer 115. In some embodiments, as shown in FIG. 16A, first signal layer 115 is disposed between the first and second conductive layers 1610 and 1650, respectively. First signal layer 115 may include any suitable configuration of conductive traces, e.g., three conductive traces 160, 54 and 51 shown in FIGS. 15 and 16A. In some embodiments, one or more conductive traces, e.g., traces 160, 54 and/or 51, may be formed of one or more strip-line traces disposed on the first signal layer 115.

In some embodiments, as shown in FIG. 16A, first signal layer 115 is disposed between the first and second insulative layers 1620 and 1640, respectively, which, in turn, are disposed between the first and second conductive layers 1610 and 1650, respectively. First insulative layer 1620 and/or the second insulative layer 1640 may include a single layer, or a plurality of layers, of any suitable dielectric or insulating material. In some embodiments, a prepreg layer (e.g., prepreg layer 1445 shown in FIG. 14), and/or other suitable material, may be disposed between the first and second insulative layers 1620 and 1640, respectively, e.g., to form a bond therebetween.

In some embodiments, as shown in FIG. 16A, the third insulative layer 1660 includes the cut-out area 1530, and may include one or more gap areas (e.g., gap area 1536 shown in FIGS. 15 and 16A) disposed in adjoining relation to the cut-out area 1530. In some embodiments, one or more surfaces of the first insulative layer 1620, the first conductive layer 1610, and/or the third insulative layer 1660 disposed adjacent to the outer periphery of the cut-out area 1530 may include one or more grooves, slots, pockets, channels or other recesses (not shown) configured to accommodate and receive therein one or more portions of a device, and/or to allow for air circulation around the device, or portion thereof, to increase heat dissipation.

PCB 1500 includes a second signal layer 215 disposed on, or otherwise associated with, the third insulative layer 1660. Second signal layer 215 may include any suitable configuration of conductive traces, e.g., six conductive traces 60, 61, 62, 63, 64 and 65 shown in FIG. 15. In some embodiments, the conductive traces 60, 61, 62 63, 64 and/or 65 may be formed of one or more microstrip traces disposed on the second signal layer 215. One or more electrical devices, electrical and/or electronic components, and/or connectors may be disposed in association with the second signal layer 215 and/or electrically-coupled to one or more conductive traces disposed on the second signal layer 215. PCB 1500 may include one or more via holes, e.g., three via holes 70, 71 and 72, configured to electrically couple one or more elements of the second signal layer 215 to one or more elements of the first signal layer 115.

In some embodiments, as shown in FIG. 15, PCB 1500 includes two devices 1580 and 1581 disposed in association with the second signal layer 215. Devices 1580 and 1581 may be electrically-coupled to one another by one or more conductive traces, e.g., two conductive traces 62 and 63 disposed on the second signal layer 215. Additionally, or alternatively, devices 1580 and 1581 may be electrically-coupled to one another by a path including three conductive traces, wherein two conductive traces 64 and 65 are disposed in association with the second signal layer 215 and connected by two via holes 71 and 72, respectively, to a conductive trace 54 disposed in association with the first signal layer 115.

PCB 1500 includes the circuit 176 and the device 170 of the PCB embodiments shown in FIG. 3 and FIGS. 12 through 14. In the embodiment shown in FIGS. 15 and 16A, the circuit 176 is disposed in association with the first signal layer 115 and electrically-coupled to one or more conductive traces 160 disposed on the first signal layer 115. Device 1580 may be electrically-coupled to the device 170 by a conductive trace 60 disposed on the first signal layer 115 connected by a via hole 70 to the one or more conductive traces 160.

As shown in FIG. 16A, the first layer stack 1603 includes the first conductive layer 1610 disposed between the third insulative layer 1660 and the first insulative layer 1620, and a cut-out area 1530 defining a void therethrough. PCB 1500 may include a gap area 1536 disposed around the outer periphery of the cut-out area 1530, e.g., in adjoining relation to the cut-out area 1530. As best shown in FIG. 15, device 170 is disposed within the cut-out area 1530. Cut-out area 1530 generally extends from the first signal layer 115 to an opening 200 defined in the second signal layer 215. In an alternative embodiment not shown, PCB 1500 may include a plurality of gap areas (e.g., first gap area 632 and second gap area 634 shown in FIG. 6), e.g., disposed in adjoining relation to the cut-out area 1530.

FIG. 16B shows a portion of a PCB 1600 according to an embodiment of the present disclosure. PCB 1600 includes the second layer stack 1604 of the PCB 1500 including the second insulative layer 1640 and the second conductive layer 1650 shown in FIG. 16A. PCB 1600 is similar to the PCB 1500 shown in FIG. 16A, except that, instead of the first layer stack 1603 of the PCB 1500 shown in FIG. 16A, the PCB 1600 includes a first layer stack 1602 and a third layer stack 1606. First layer stack 1602 of the PCB 1600 includes the first insulative layer 1620 and the first conductive layer 1610 shown in FIG. 16A. First layer stack 1602 further includes a portion of the cut-out area 1530 defining a void that extends from the first signal layer 115 through the first conductive layer 1610. Third layer stack 1606 of the PCB 1600 includes the third insulative layer 1660 shown in FIG. 16A disposed in association with the second conductive layer 1650 of the first layer stack 1602. A prepreg layer and/or other suitable material (not shown) may be disposed between the third insulative layer 1660 and the first conductive layer 1610. As shown in FIG. 16B, third layer stack 1606 includes a portion of the cut-out area 1530 defined therethrough.

It is to be understood that the configuration of the first layer stack 1603 of the PCB 1500, and the configuration of the first layer stack 1602 of the PCB 1600, are merely illustrative and non-limiting examples of layer stack-ups, and that PCB layer stacks including a conductive layer (e.g., ground or power plane) and one or more cut-out areas (e.g., two cut-out areas 1303 and 1430 shown in FIG. 14) defining a void extending therethrough according to embodiments of the present disclosure may utilize many different configurations of layer stack-ups, some with fewer, or additional, layer stacks than depicted in the PCB embodiments of FIGS. 15, 16A and 16B.

FIG. 17 shows a portion of a PCB 1700 according to an embodiment of the present disclosure. PCB 1700 includes a first signal layer 315. PCB 1700 generally includes the first conductive layer 1610, the second conductive layer 1650, and the second signal layer 215 of the PCB 1500 shown in FIGS. 15 and 16A.

First signal layer 315 includes one or more electrically-conductive traces disposed in association with the insulative layer 1740. One or more electrical devices, electrical and/or electronic components, and/or connectors may be disposed in association with the first signal layer 315 and/or electrically-coupled to one or more conductive traces disposed on the first signal layer 315. First signal layer 315 may include any suitable configuration of conductive traces, e.g., four conductive traces 1761, 1762, 1763 and 1764 shown in FIG. 17. In some embodiments, the conductive traces 1761, 1762, 1763 and/or 1764 may be formed of one or more microstrip traces disposed on the first signal layer 315. Second signal layer 215 may include any suitable configuration of conductive traces, e.g., six conductive traces 60, 61, 62, 63, 64 and 65 shown in FIG. 15. PCB 1700 may include one or more devices (e.g., device 1581) disposed in operative association with the second signal layer 215 and/or the first signal layer 315.

PCB 1700 includes an inner or first layer stack 1720 disposed between the first and second conductive layers 1610 and 1650, respectively. First layer stack 1720 may include one or more layers of any suitable dielectric or insulating material. First layer stack 1720 may include one or more layers of prepreg material (not shown). In an alternative embodiment not shown, first layer stack 1720 may include the first conductive layer 1610 and/or the second conductive layer 1650.

One or more signal layers may be disposed in association with the first layer stack 1720. As shown in FIG. 17, PCB 1700 includes an asymmetric strip-line configuration including two internal signal layers 1716 and 1717 disposed within the inner layer stack 1720. Asymmetric strip-line impedance calculations may depend on a variety of factors, such as material properties of the material(s) forming the insulative layers, the configuration of insulative layers, and the configuration of signal layers, among other factors.

PCB 1700 includes a second layer stack 1707 including an insulative layer 1660 disposed in association with the first conductive layer 1610. Insulative layer 1660 may include a single layer, or a plurality of layers, of any suitable dielectric or insulating material. A prepreg layer and/or other suitable material (not shown) may be disposed between the insulative layer 1660 and the first conductive layer 1610, e.g., to form a bond therebetween. In an alternative embodiment not shown, wherein the first layer stack 1720 includes the first conductive layer 1610, the second layer stack 1707 includes the insulative layer 1660, and may include prepreg and/or other suitable material, e.g., to form a bond between the insulative layer 1660 and the first conductive layer 1610.

As shown in FIG. 17, second signal layer 215 is disposed in association with the second layer stack 1707. One or more metal-filled through-holes, or vias (not shown), may be disposed in association with the insulative layer 1660, and may be configured to electrically-couple one or more elements of the second signal layer 215 to one or more elements of the internal signal layer 1716 and/or the internal signal layer 1717.

In some embodiments, as shown in FIG. 17, PCB 1700 includes a third layer stack 1709 including an insulative layer 1740 disposed in association with the second conductive layer 1650. In an alternative embodiment not shown, wherein the first layer stack 1720 includes the second conductive layer 1650, the third layer stack 1709 includes the insulative layer 1740, and may include prepreg and/or other suitable material, e.g., to form a bond between the insulative layer 1740 and the second conductive layer 1650.

First signal layer 315 is disposed in association with the second layer stack 1709. One or more microstrip traces, e.g., four traces 1761, 1762, 1763 and 1764, may be disposed on the insulative layer 1740, and may route signal, power, and/or ground lines to and from the circuitry disposed in association with the insulative layer 1740. One or more metal-filled through-holes, or vias (not shown), may be disposed in association with the insulative layer 1740, and may be configured to electrically-couple one or more elements of the first signal layer 315 to one or more elements of the internal signal layer 1716 and/or the internal signal layer 1717.

Hereinafter, methods of manufacturing a PCB in accordance with the present disclosure are described with reference to FIGS. 18 through 26. It is to be understood that the steps of the methods provided herein may be performed in combination and in a different order than presented herein without departing from the scope of the disclosure. In the methods of manufacturing printed circuit boards provided herein, the "first" layer stack 102 shown in FIG. 3 may be referred to as "second" layer stack 102 and the "second" layer stack 104 of FIG. 3 may be referred to as "first" layer stack 104, for ease of explanation.

Figure 18:
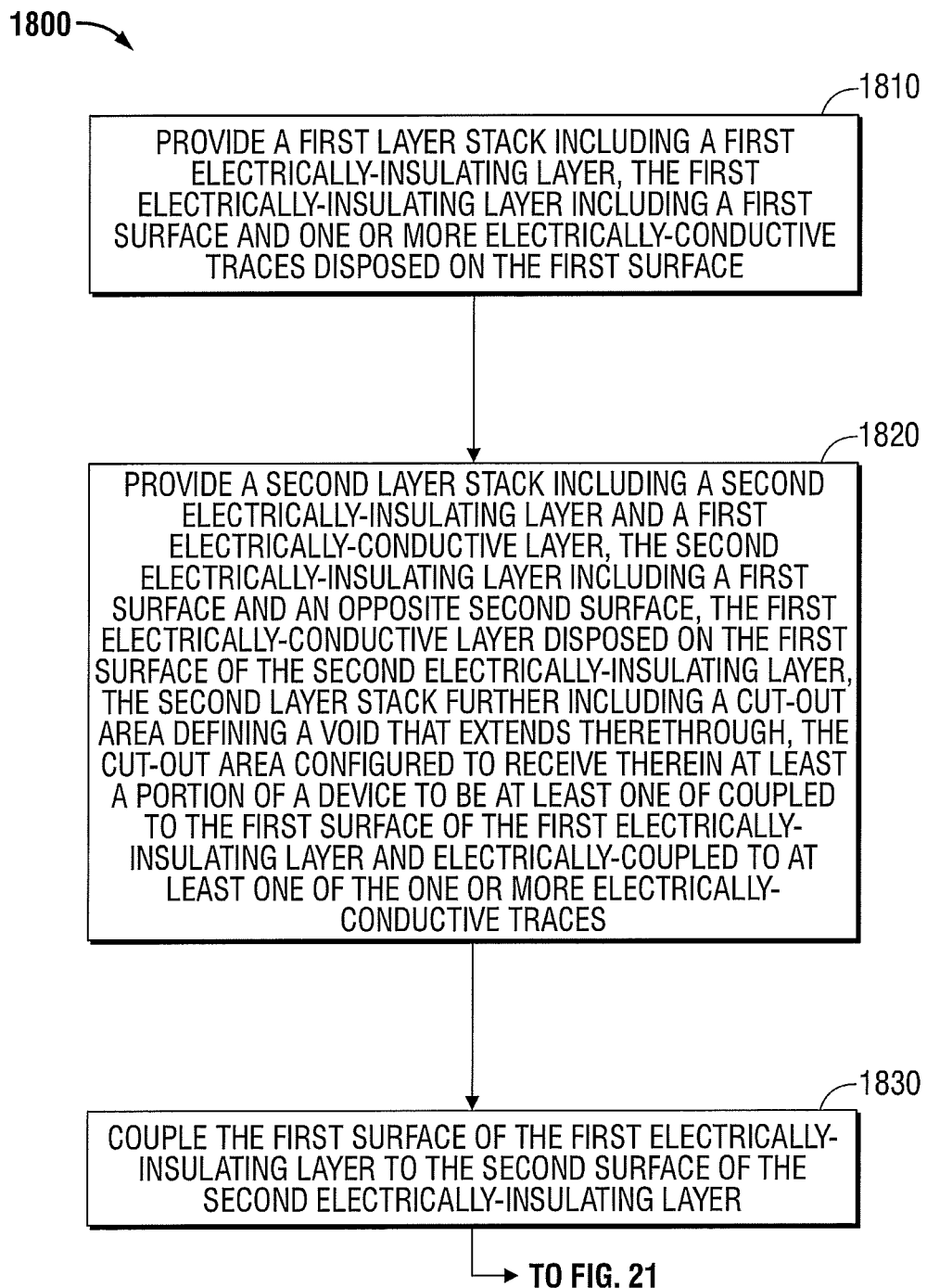
FIG. 18 is a flowchart illustrating a method of manufacturing a PCB in accordance with an embodiment of the present disclosure.

FIG. 18 is a flowchart illustrating a method (shown generally as 1800 in FIG. 18) of manufacturing a PCB in accordance with an embodiment of the present disclosure. In step 1810, a first layer stack 104 is provided. First layer stack 104 includes a first electrically-insulating layer 140. First electrically-insulating layer 140 includes a first surface 141 and one or more electrically-conductive traces 160 disposed on the first surface 141.

In step 1820, a second layer stack 102 is provided. Second layer stack 102 includes a second electrically-insulating layer 120 and a first electrically-conductive layer 110. The second electrically-insulating layer 120 includes a first surface 121 and an opposite second surface 122. First electrically-conductive layer 110 may be disposed on the first surface 121 of the second electrically-insulating layer 120. Alternatively, a prepreg layer and/or other suitable material (not shown) may be disposed between the first surface 121 of second electrically-insulating layer 120 and the first electrically-conductive layer 110, e.g., to form a bond therebetween.

Second layer stack 102 includes a cut-out area 130 defining a void that extends therethrough. Cut-out area 130 is configured to receive therein at least a portion of a device 170 to be coupled to the first surface 141 of the first electrically-insulating layer 140 and/or electrically-coupled to one or more of the one or more electrically-conductive traces 160.

In step 1830, the first surface 141 of the first electrically-insulating layer 140 is coupled to the second surface 122 of the second electrically-insulating layer 120. The step 1830 may include the step of orienting the first layer stack 104 and the second layer stack 102 in relation to one another such that the first surface 141 of the first electrically-insulating layer 140 opposes the second surface 122 of the second electrically-insulating layer 120. The step 1830 may further include positioning the first layer stack 104 and the second layer stack 102 in relation to one another such that the cut-out area 130 is positioned to receive at least a portion of the device 170 therein when the first surface 141 of the first electrically-insulating layer 140 is placed in contact with the second surface 122 of the second electrically-insulating layer 120.

The above-described method 1800 of manufacturing a PCB may additionally include the step of mounting the device 170 on the first layer stack 104. The mounting step may include the step of electrically-coupling the device 170 to one or more of the one or more electrically-conductive traces 160.

In some embodiments, the above-described method 1800 of manufacturing a PCB may additionally, or alternatively, include one or more of the steps shown in FIG. 21, FIG. 22 and/or FIG. 23, which are described later in this description.

The above-described method 1800 of manufacturing a PCB may additionally include the step of coupling a third layer stack (e.g., third layer stack 1606 shown in FIG. 16B, or third layer stack 1709 shown in FIG. 17) to the first layer stack 104 (or the second layer stack 102). The third layer stack may include a third electrically-insulating layer (e.g., 1660 shown in FIG. 16B) and a signal layer 215 disposed in association with a first surface of the third electrically-insulating layer.

Figure 19:
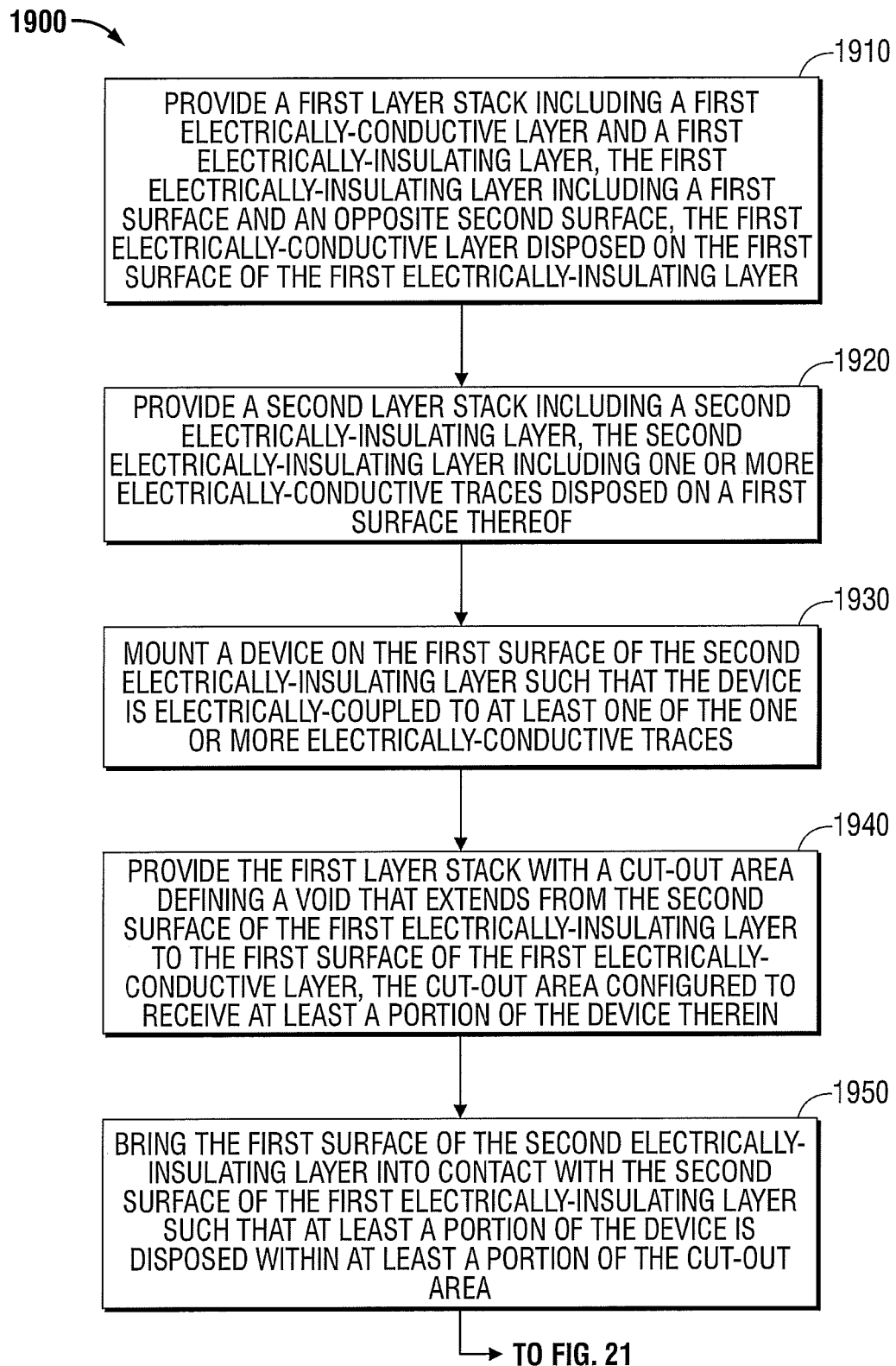
FIG. 19 is a flowchart illustrating a method of manufacturing a PCB in accordance with an embodiment of the present disclosure.

FIG. 19 is a flowchart illustrating a method (shown generally as 1900 in FIG. 19) of manufacturing a PCB in accordance with an embodiment of the present disclosure. In step 1910, a first layer stack 102 is provided. First layer stack 102 includes a first electrically-conductive layer 110 and a first electrically-insulating layer 120. First electrically-insulating layer 120 includes a first surface 121 and an opposite second surface 122. First electrically-conductive layer 110 is disposed on the first surface 121 of the first electrically-insulating layer 120.

In step 1920, a second layer stack 104 is provided. The second layer stack 104 includes a second electrically-insulating layer 140. Second electrically-insulating layer 140 includes one or more electrically-conductive traces 160 disposed on a first surface 141 thereof.

In step 1930, a device 170 is mounted on the first surface 141 of the second electrically-insulating layer 140 such that the device 170 is electrically-coupled to at least one of the one or more electrically-conductive traces 160.

In step 1940, the first layer stack 102 is provided with a cut-out area 130 defining a void that extends from the second surface 122 of the first electrically-insulating layer 120 to the first surface 111 of the first electrically-conductive layer 110.

Cut-out area 130 is configured to receive at least a portion of the device 170 therein.

In step 1950, the first surface 141 of the second electrically-insulating layer 140 is brought in contact with the second surface 122 of the first electrically-insulating layer 120 such that at least a portion of the device 170 is disposed within at least a portion of the cut-out area 130.

Figure 21:
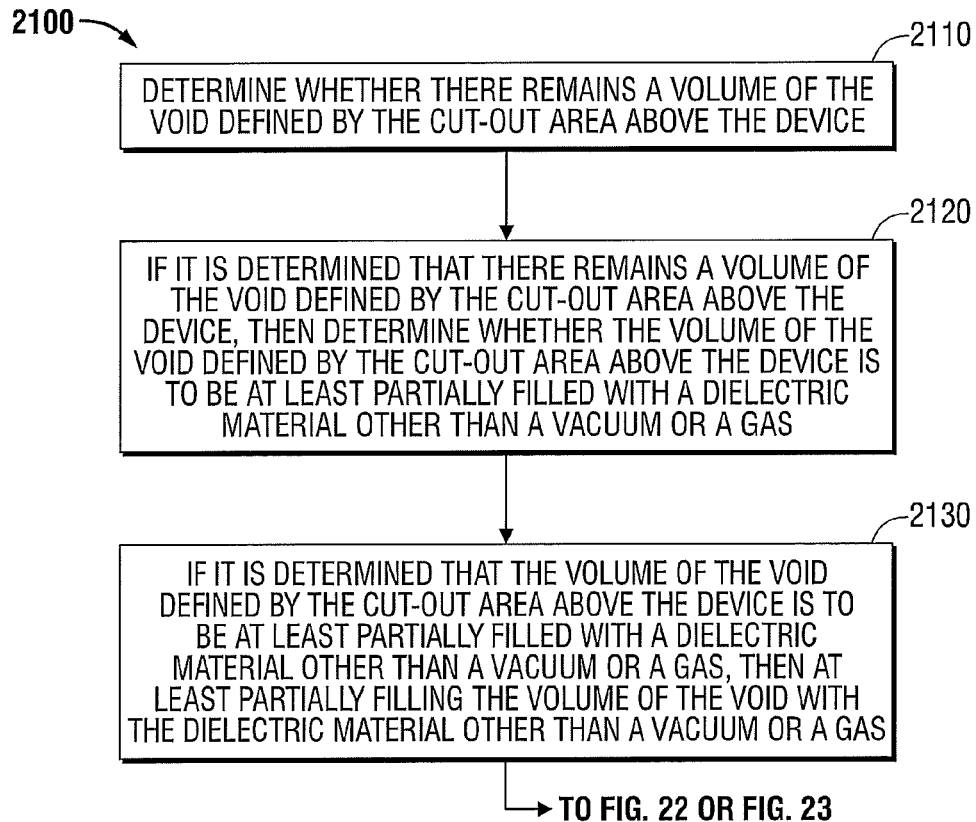
FIG. 21 is a flowchart illustrating a method of manufacturing a PCB in accordance with another embodiment of the present disclosure.

In some embodiments, the above-described method (shown generally as 1900 in FIG. 19) may include one or more of the additional steps shown in FIG. 21.

Figure 20:
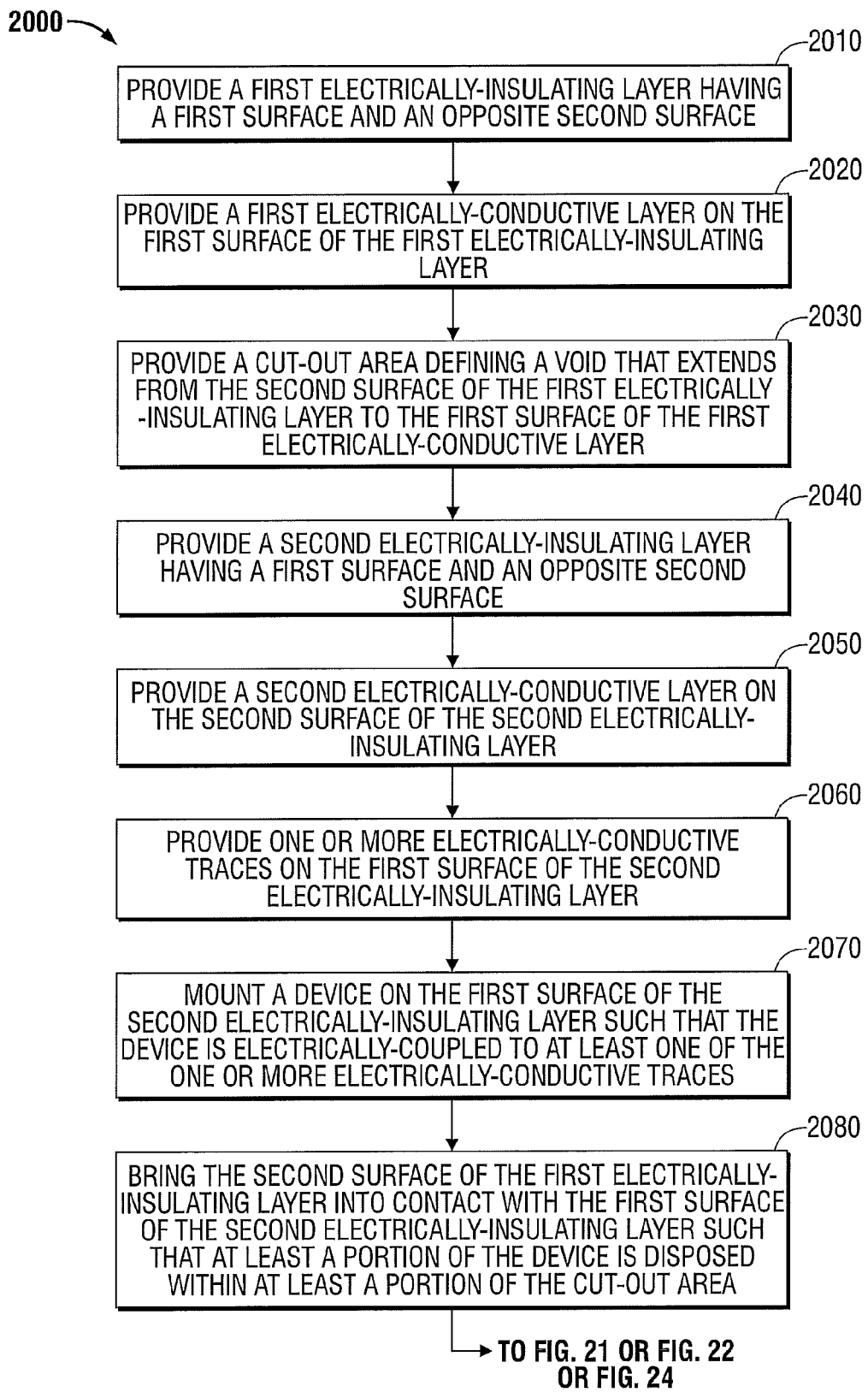
FIG. 20 is a flowchart illustrating a method of manufacturing a PCB in accordance with another embodiment of the present disclosure.

FIG. 20 is a flowchart illustrating a method of manufacturing a PCB in accordance with an embodiment of the present disclosure. In step 2010, a first electrically-insulating layer 120 is provided. First electrically-insulating layer 120 includes a first surface 121 and an opposite second surface 122.

In step 2020, a first electrically-conductive layer 110 is provided on the first surface 121 of the first electrically-insulating layer 120.

In step 2030, a cut-out area 130 is provided that defines a void that extends from the second surface 122 of the first electrically-insulating layer 120 to the first surface 111 of the first electrically-conductive layer 110.

In step 2040, a second electrically-insulating layer 140 is provided that includes a first surface 141 and an opposite second surface 142.

In step 2050, a second electrically-conductive layer 150 is provided on the second surface 142 of the second electrically-insulating layer 140.

In step 2060, one or more electrically-conductive traces 160 are provided on the first surface 141 of the second electrically-insulating layer 140.

In step 2070, a device 170 is mounted on the first surface 141 of the second electrically-insulating layer 140 such that the device 170 is electrically-coupled to at least one of the one or more electrically-conductive traces 160.

In step 2080, the second surface 122 of the first electrically-insulating layer 120 is placed in contact with the first surface 141 of the second electrically-insulating layer 140 such that at least a portion of the device 170 is disposed within at least a portion of the cut-out area 130.

Figure 22:
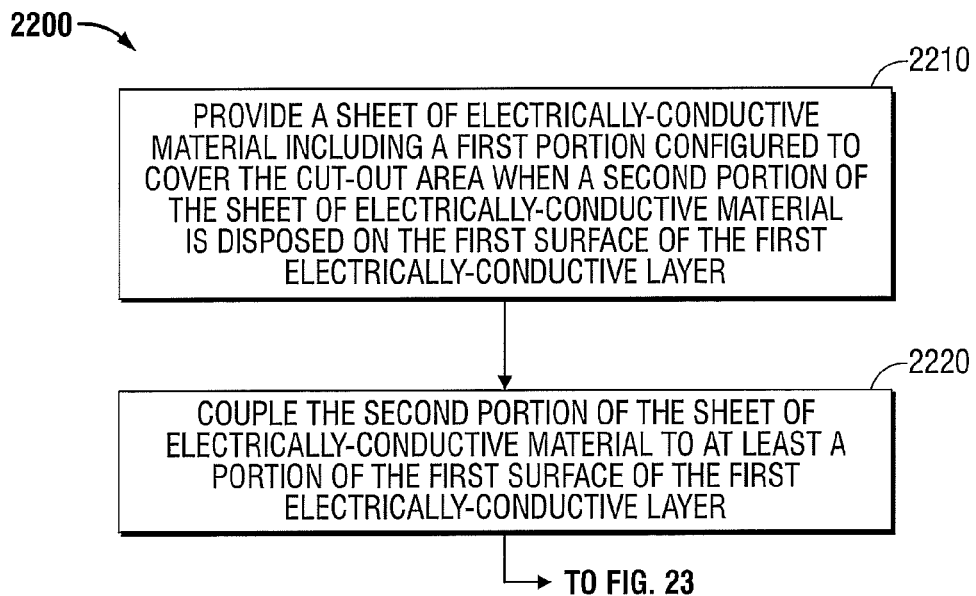
FIG. 22 is a flowchart illustrating a method of manufacturing a PCB in accordance with yet another embodiment of the present disclosure.

In some embodiments, the above-described method (shown generally as 2000 in FIG. 20) may include one or more of the additional steps shown in FIGS. 21, 22 and/or 23.

FIG. 21 is a flowchart illustrating steps of a method for manufacturing a PCB in accordance with an embodiment of the present disclosure. In step 2110, a determination is made whether there remains any portion (e.g., volume) of the void defined by the cut-out area 130 extending outwardly from (e.g., above) the device 170.

In step 2120, if it is determined that there remains a volume of the void defined by the cut-out area 130 above the device 170, then a determination is made whether the volume of the void defined by the cut-out area 130 above the device 170 is to be at least partially filled with a dielectric material 180 other than a vacuum or a gas (or mixture of gases, such as air).

In step 2130, if it is determined that the volume of the void defined by the cut-out area 130 above the device 170 is to be at least partially filled with a dielectric material 180 other than a vacuum or a gas or a gas mixture, then at least partially filling the volume of the void with the dielectric material other than a vacuum or a gas or a mixture of gases.

Figure 23:
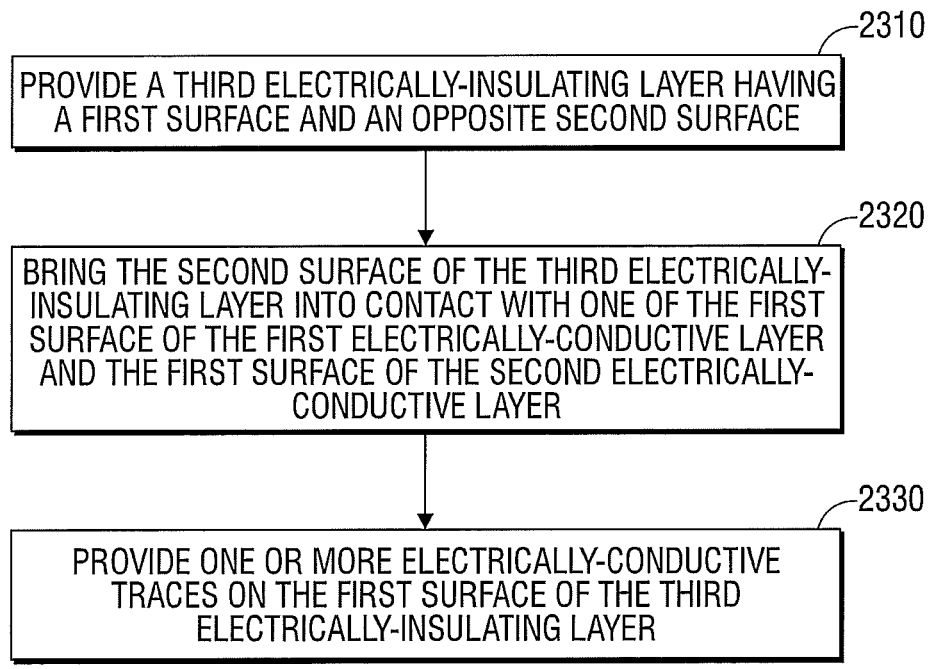
FIG. 23 is a flowchart illustrating a method of manufacturing a PCB in accordance with yet another embodiment of the present disclosure.

In some embodiments, the above-described method (shown generally as 2100 in FIG. 21) may include one or more of the additional steps shown in FIG. 22 and/or FIG. 23.

FIG. 22 is a flowchart illustrating steps of a method for manufacturing a PCB in accordance with an embodiment of the present disclosure. In step 2210, a sheet of electrically-conductive material is provided. The sheet of electrically-conductive material 190 includes a first portion 194 configured to cover the cut-out area 130 when a second portion 195 of the sheet of electrically-conductive material 190 is disposed on the first surface 111 of the first electrically-conductive layer 110. In some embodiments, the sheet of electrically-conductive material 190 may be a conductive tape, e.g., carbon conductive tape, copper conductive tape, silver conductive adhesive sheet.

In step 2220, the second portion 195 of the sheet of the electrically-conductive material 190 is coupled to at least a portion of the first surface 111 of the first electrically-conductive layer 110. In some embodiments, prior to the step 2220, an area 113 of the first electrically-conductive layer 110, e.g., a portion adjacent to the outer peripheral edges of the cut-out area 130, may be removed, e.g., photo-etched. In some embodiments, the first electrically-conductive layer 110 of the first stack 102 may be formed, patterned or otherwise deposited to eschew the area 113, e.g., to reduce assembly steps and/or fabrication costs, in which case the second portion 195 of the sheet of electrically-conductive material 190 may be coupled to the first surface 121 of the first electrically-insulating layer 120.

In some embodiments, the above-described method (shown generally as 2200 in FIG. 22) may include one or more of the additional steps shown in FIG. 23.

FIG. 23 is a flowchart illustrating steps of a method for manufacturing a PCB in accordance with an embodiment of the present disclosure. In step 2310, a third electrically-insulating layer 1660 is provided. Third electrically-insulating layer 1660 includes a first surface 1661 and an opposite second surface 1662.

In step 2320, the second surface 1662 of the third electrically-insulating layer 1660 is placed in contact with the first surface 111 of the first electrically-conductive layer 110 or the first surface 151 of the second electrically-conductive layer 150.

In step 2330, one or more electrically-conductive traces 62, 63 are provided on the first surface 1661 of the third electrically-insulating layer 1660.

Figure 24:
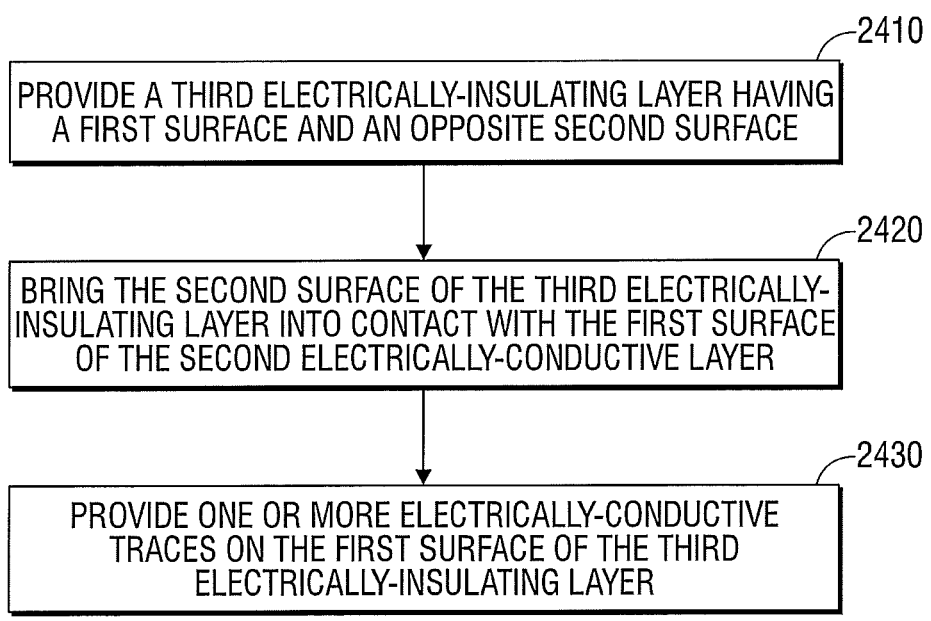
FIG. 24 is a flowchart illustrating a method of manufacturing a PCB in accordance with yet another embodiment of the present disclosure.

FIG. 24 is a flowchart illustrating steps of a method for manufacturing a PCB in accordance with an embodiment of the present disclosure. In step 2410, a third electrically-insulating layer 1660 is provided. Third electrically-insulating layer 1660 includes a first surface 1661 and an opposite second surface 1662.

In step 2420, the second surface 1662 of the third electrically-insulating layer 1660 is placed in contact with the first surface 151 of the second electrically-conductive layer 150.

In step 2430, one or more electrically-conductive traces 62, 63 are provided on the first surface of the third electrically-insulating layer 1660.

Figure 25:
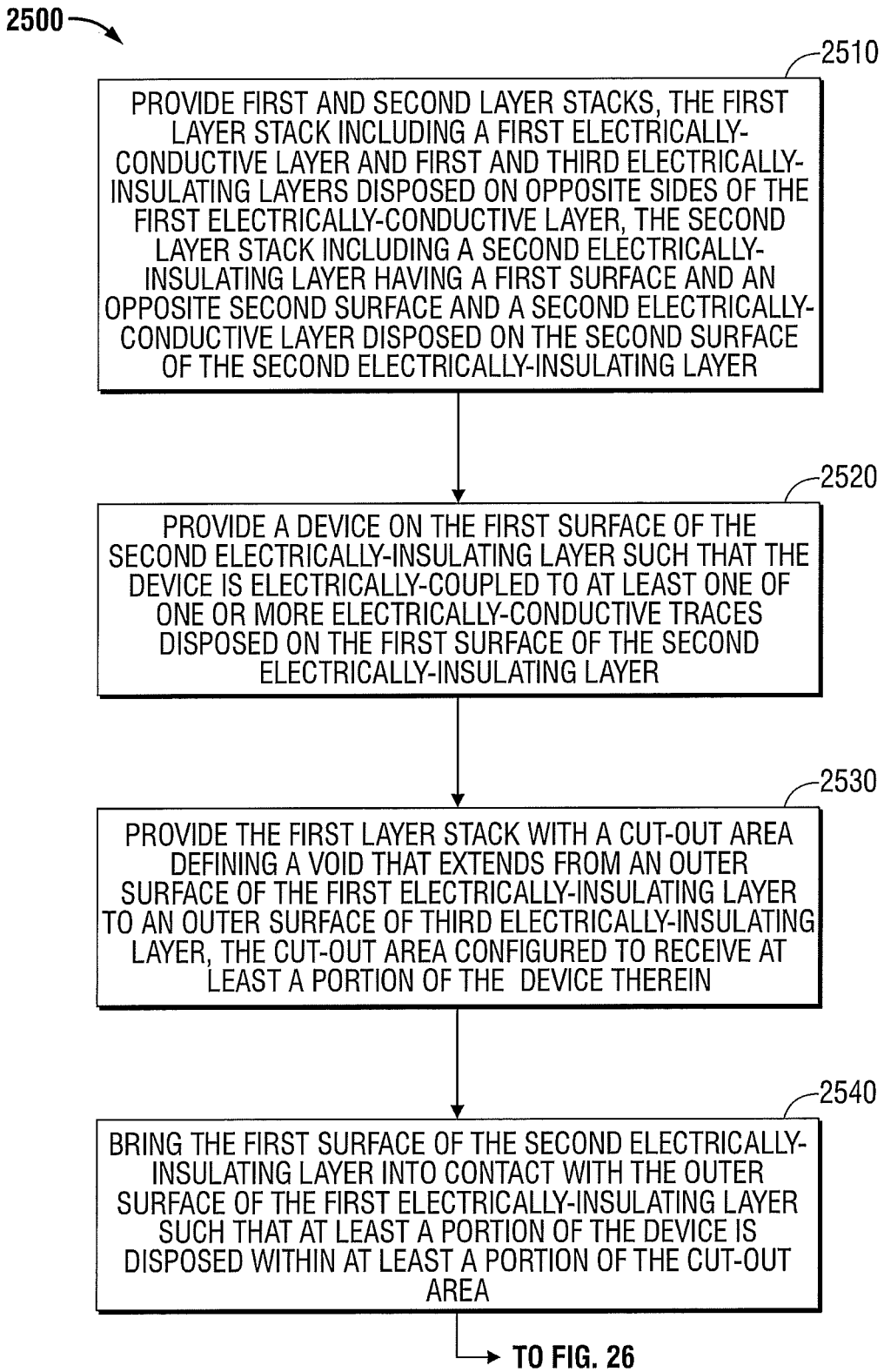
FIG. 25 is a flowchart illustrating a method of manufacturing a PCB in accordance with still another embodiment of the present disclosure.

FIG. 25 is a flowchart illustrating steps of a method for manufacturing a PCB in accordance with an embodiment of the present disclosure. In step 2510, a first layer stack 702 and a second layer stack 104 are provided. The first layer stack 1603 includes a first electrically-conductive layer 1610 and first and third electrically-insulating layers 1620 and 1660, respectively, disposed on opposite sides of the first electrically-conductive layer 1610. The second layer stack 1604 includes a second electrically-insulating layer 1640 having a first surface 1641 and an opposite second surface 1642 and a second electrically-conductive layer 1640 disposed on the second surface 1642 of the second electrically-insulating layer 1650.

In step 2520, a device 170 or 1070 is provided on the first surface 1641 of the second electrically-insulating layer 1640 such that the device 170 or 1070 is electrically-coupled to one or more of the one or more electrically-conductive traces 160 disposed on the first surface 1641 of the second electrically-insulating layer 1640.

In step 2530, the first layer stack 1603 is provided with a cut-out area 1530 defining a void that extends from an outer surface of the first electrically-insulating layer 1620 to an outer surface 1661 of third electrically-insulating layer 1660. The cut-out area 1530 is configured to receive at least a portion of the device 170 or 1070 therein.

In step 2540, the first surface 1641 of the second electrically-insulating layer 1640 is placed in contact with the outer surface of the first electrically-insulating layer 1620 such that at least a portion of the device 170 or 1070 is disposed within at least a portion of the cut-out area 1530.

Figure 26:
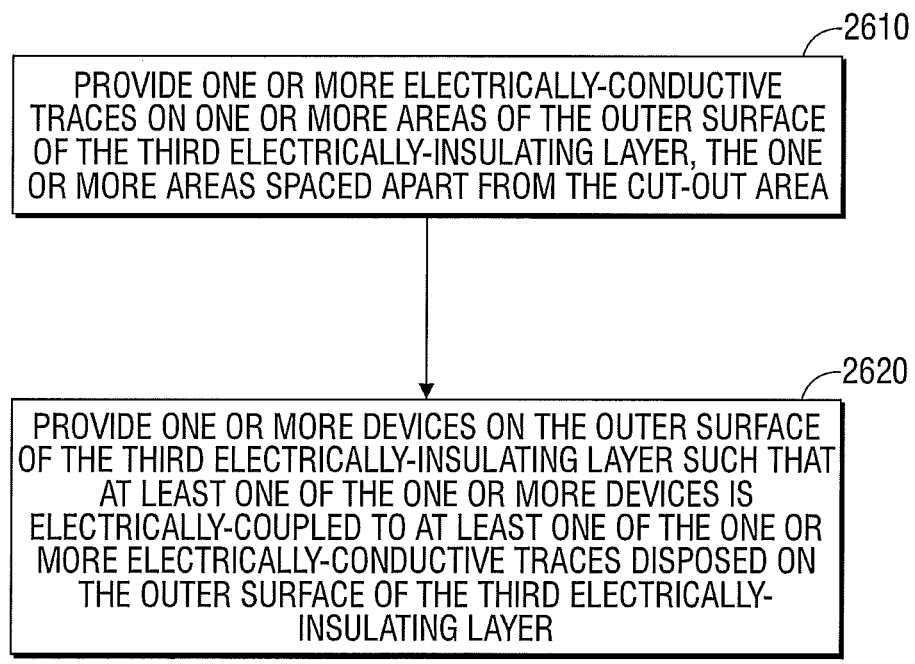
FIG. 26 is a flowchart illustrating a method of manufacturing a PCB in accordance with still another embodiment of the present disclosure.

FIG. 26 is a flowchart illustrating steps of a method for manufacturing a PCB in accordance with an embodiment of the present disclosure. In step 2610, a pattern of one or more electrically-conductive traces 62, 63 is provided on one or more areas of the outer surface 1661 of the third electrically-insulating layer 1660. The one or more areas are spaced apart from the cut-out area 1530.

In step 2620, one or more devices 1581 are provided on the outer surface 1661 of the third electrically-insulating layer 1660 such that one or more of the one or more devices 1581 is electrically-coupled to one or more of the one or more electrically-conductive traces 62, 63 disposed on the outer surface 1661 of the third electrically-insulating layer 1660.

Various embodiments of the above-disclosed PCBs include at least one layer stack that includes an electrically-conductive layer (e.g., a ground plane or a power plane), an electrically-insulating layer, and one or more cut-out areas defining a void that extends therethrough.

Providing PCBs including one or more layer stacks that include one or more cut-out areas configured to receive at least a portion of a device therein according to embodiments of the present disclosure may allow for modularity in the design of PCBs and/or may allow for ease of assembly, e.g., allowing for electrical connection of the device(s) to one or more signal layers.

Various embodiments of the presently-disclosed PCBs including one or more cut-out areas defined in one or more layer stacks may be suitable for use in a variety of PCB applications across a wide range of industries, e.g., the medical, military, aerospace, telecommunication, and automotive industries, in a broad spectrum of technologies.

Although embodiments have been described in detail with reference to the accompanying drawings for the purpose of illustration and description, it is to be understood that the inventive processes and apparatus are not to be construed as limited thereby. It will be apparent to those of ordinary skill in the art that various modifications to the foregoing embodiments may be made without departing from the scope of the disclosure.

What is claimed is:

1. A multi-layer printed circuit board (PCB), comprising:
a first layer stack including a first electrically-insulating layer, a second electrically-insulating layer, and a first electrically-conductive layer disposed between the first and second electrically-insulating layers;
a second layer stack coupled to the first layer stack, the second layer stack including a third electrically-insulating layer and a second electrically-conductive layer, wherein at least one of the first layer stack or the second layer stack includes a cut-out area defining a void that extends therethrough;

a first signal layer disposed in association with one of the first electrically-insulating layer of the first layer stack and the third electrically-insulating layer of the second layer stack;

a second signal layer disposed in association with the second electrically-insulating layer of the first layer stack;

a device at least partially disposed within the cut-out area and electrically-coupled to at least one of the first signal layer and the second signal layer; and a sheet of electrically-conductive material including a first portion covering the cut-out area and a second portion disposed on at least a portion of one of the first electrically-conductive layer and the second electrically-conductive layer, wherein the sheet of electrically-conductive material is disposed in spaced relation relative to a top surface of the device.

2. The PCB of claim 1, wherein the cut-out area is configured to receive therein at least a portion of the device.

3. The PCB of claim 1, further comprising one or more gap areas disposed in adjoining relation to the cut-out area.

4. The PCB of claim 3, wherein the one or more gap areas are configured to physically isolate the device from one of the first electrically-conductive layer and the second electrically-conductive layer.

5. The PCB of claim 3, wherein the one or more gap areas are configured to electrically isolate the device from one of the first electrically-conductive layer and the second electrically-conductive layer.

6. The PCB of claim 1, wherein the void defined by the cut-out area includes a first volume of void space defined between a top surface of the device and a plane containing an outer surface of one of the first electrically-conductive layer and the second electrically-conductive layer.

7. The PCB of claim 6, further comprising dielectric material disposed in at least a portion of the first volume of void space.

8. A method of manufacturing a printed circuit board (PCB), comprising the steps of:

providing first and second layer stacks, the first layer stack including a first electrically-conductive layer and first and third electrically-insulating layers disposed on first and second surfaces of the first electrically-conductive layer, the second layer stack including a second electrically-insulating layer having a first surface and an opposite second surface, the second layer stack further including a second electrically-conductive layer disposed on the second surface of the second electrically-insulating layer;

providing a device on the first surface of the second electrically-insulating layer such that the device is electrically-coupled to at least one of one or more electrically-conductive traces disposed on the first surface of the second electrically-insulating layer;

providing the first layer stack with a cut-out area defining a void that extends from an outer surface of the first electrically-insulating layer to an outer surface of third electrically-insulating layer, the cut-out area configured to receive at least a portion of the device therein;

placing the first surface of the second electrically-insulating layer in contact with the outer surface of the first electrically-insulating layer such that at least a portion of the device is disposed within at least a portion of the cut-out area; and providing a sheet of electrically-conductive material including a first portion to cover the cut-out area when a second portion of the sheet of electrically-conductive material is disposed on the first surface of the first electrically-conductive layer, the first portion of the sheet of electrically-conductive material disposed in spaced relation relative to a top surface of the device.

9. The method of manufacturing a PCB of claim 8, wherein a height of the device is greater than a height of the first layer stack.

10. The method of manufacturing a PCB of claim 8, further comprising the steps of providing a heat sink disposed in association with the top surface of the device.

11. The method of manufacturing a PCB of claim 8, further comprising the steps of:

providing a pattern of one or more electrically-conductive traces on one or more areas of the outer surface of the third electrically-insulating layer, the one or more areas spaced apart from the cut-out area; and providing one or more devices on the outer surface of the third electrically-insulating layer such that at least one of the one or more devices is electrically-coupled to at least one of the one or more electrically-conductive traces disposed on the outer surface of the third electrically-insulating layer.

12. The method of manufacturing a PCB of claim 8, further comprising the step of coupling the second portion of the sheet of the electrically-conductive material to at least a portion of the first surface of the first electrically-conductive layer.

13. The method of manufacturing a PCB of claim 8, further comprising the steps of:

removing an area of the first electrically-conductive layer adjacent to outer peripheral edges of the cut-out area to form an exposed portion of the outer surface of the first electrically-insulating layer; and coupling the second portion of the sheet of the electrically-conductive material to the exposed portion of the outer surface of the first electrically-insulating layer.

* * * * *